US012733177B2

(12) United States Patent
Sharma et al.

(10) Patent No.: US 12,733,177 B2

(45) Date of Patent: Sep. 8, 2026

(54) PROGRAMMABLE CAPACITOR MEMORY ARRAYS WITH STACKED ACCESS TRANSISTORS

(71) Applicant: Intel Corporation, Santa Clara, CA (US)

(72) Inventors: Abhishek Anil Sharma, Portland, OR (US); Tahir Ghani, Portland, OR (US); Anand Murthy, Portland, OR (US); Wilfred Gomes, Portland, OR (US)

(73) Assignee: Intel Corporation, Santa Clara, CA (US)

(*) Notice: Subject to any disclaimer, the term of this patent is extended or adjusted under 35 U.S.C. 154(b) by 238 days.

(21) Appl. No.: 17/856,872

(22) Filed: Jul. 1, 2022

(65) Prior Publication Data

US 2024/0008291 A1 Jan. 4, 2024

(51) Int. Cl.

| | |
|---|---|
| ***H10B 53/30*** | (2023.01) |
| ***H10B 53/20*** | (2023.01) |
| ***H10D 1/68*** | (2025.01) |
| ***H10D 30/01*** | (2025.01) |
| ***H10D 30/43*** | (2025.01) |
| ***H10D 30/67*** | (2025.01) |

(Continued)

(52) U.S. Cl.

CPC ............. *H10B 53/30* (2023.02); *H10B 53/20* (2023.02); *H10D 1/682* (2025.01); *H10D 30/014* (2025.01); *H10D 30/43* (2025.01); *H10D 30/6735* (2025.01); *H10D 30/6757* (2025.01); *H10D 62/121* (2025.01); *H10W 40/73* (2026.01)

(58) Field of Classification Search

CPC ....... H10B 53/30; H10B 53/20; H01L 23/427; H10D 1/682; H10D 30/014; H10D 30/43; H10D 30/6735; H10D 30/6757; H10D 62/121

See application file for complete search history.

(56) References Cited

U.S. PATENT DOCUMENTS

| | | | | |
|---|---|---|---|---|
| 2006/0289942 A1 | 12/2006 | Horii et al. | | |
| 2021/0159229 A1* | 5/2021 | Gomes | ................ | H10D 62/121 |
| 2021/0257366 A1 | 8/2021 | Lee | | |

(Continued)

FOREIGN PATENT DOCUMENTS

| | | |
|---|---|---|
| WO | 2019117904 A1 | 6/2019 |

OTHER PUBLICATIONS

IBM News Blog, "Introducing the world's first 2 nm node chip", published in May 6, 2021 (https://research.ibm.com/blog/2-nm-chip) (Year: 2021).*

*Primary Examiner* — Jay C Kim

*Assistant Examiner* — Woo K Lee

(74) *Attorney, Agent, or Firm* — Essential Patents Group, LLP

(57) ABSTRACT

Bits are stored in an array with multiple capacitors per access transistor. An array of multiple ferroelectric capacitors shares a nanowire or nanosheet as a common plate and stores information accessed by a single common select transistor, which uses the nanowire or nanosheet for its channel. In an integrated circuit (IC) system, a group of bitlines is connected to a capacitor array by arrays of nanowires or nanosheets and wordline-controlled non-planar transistors. An IC die with a capacitor array accessed by a single select transistor and sharing a nanowire or nanosheet is coupled to a power supply and a cooling structure.

23 Claims, 13 Drawing Sheets

(51) Int. Cl.
*H10D 62/10* (2025.01)
*H10W 40/73* (2026.01)

(56) References Cited

U.S. PATENT DOCUMENTS

| | | | | |
|---|---|---|---|---|
| 2021/0280761 | A1* | 9/2021 | Kim | H01L 23/38 |
| 2022/0077151 | A1* | 3/2022 | Lee | H10B 12/482 |

* cited by examiner 488
402
489
416
478
477
M12
479
453
M11
452
M10
454
M9
M8
404
M7
M6
M5
M4/V3
M3/V2
M2/V1
M1
V0
M0
C1
C0
125
412
122
450
444
126
414
BM0
BM1
451
405
454
BM2
MIM
453
BM3
455
406
Bump

499

MEMORY 821
LOGIC 825
COMMUNICATION DEVICE 822
INTERCONNECTS, RDL LAYERS, MIM 826
PROCESSING DEVICE 801
REFRIGERATION DEVICE 823
HEAT REGULATION DEVICE 827
BATTERY/POWER REGULATION DEVICE 824
HARDWARE SECURITY DEVICE 828

COMPUTING DEVICE 800
PROCESSING DEVICE 801
COMMUNICATION CHIP 807
MEMORY 802
BATTERY/POWER 808
DISPLAY DEVICE 803
GPS DEVICE 809
AUDIO OUTPUT DEVICE 804
AUDIO INPUT DEVICE 810
OTHER OUTPUT DEVICE 805
OTHER INPUT DEVICE 811
HEAT REGULATOR/ REFRIGERATION DEVICE 806
SECURITY INTERFACE DEVICE 812
ANTENNA 813

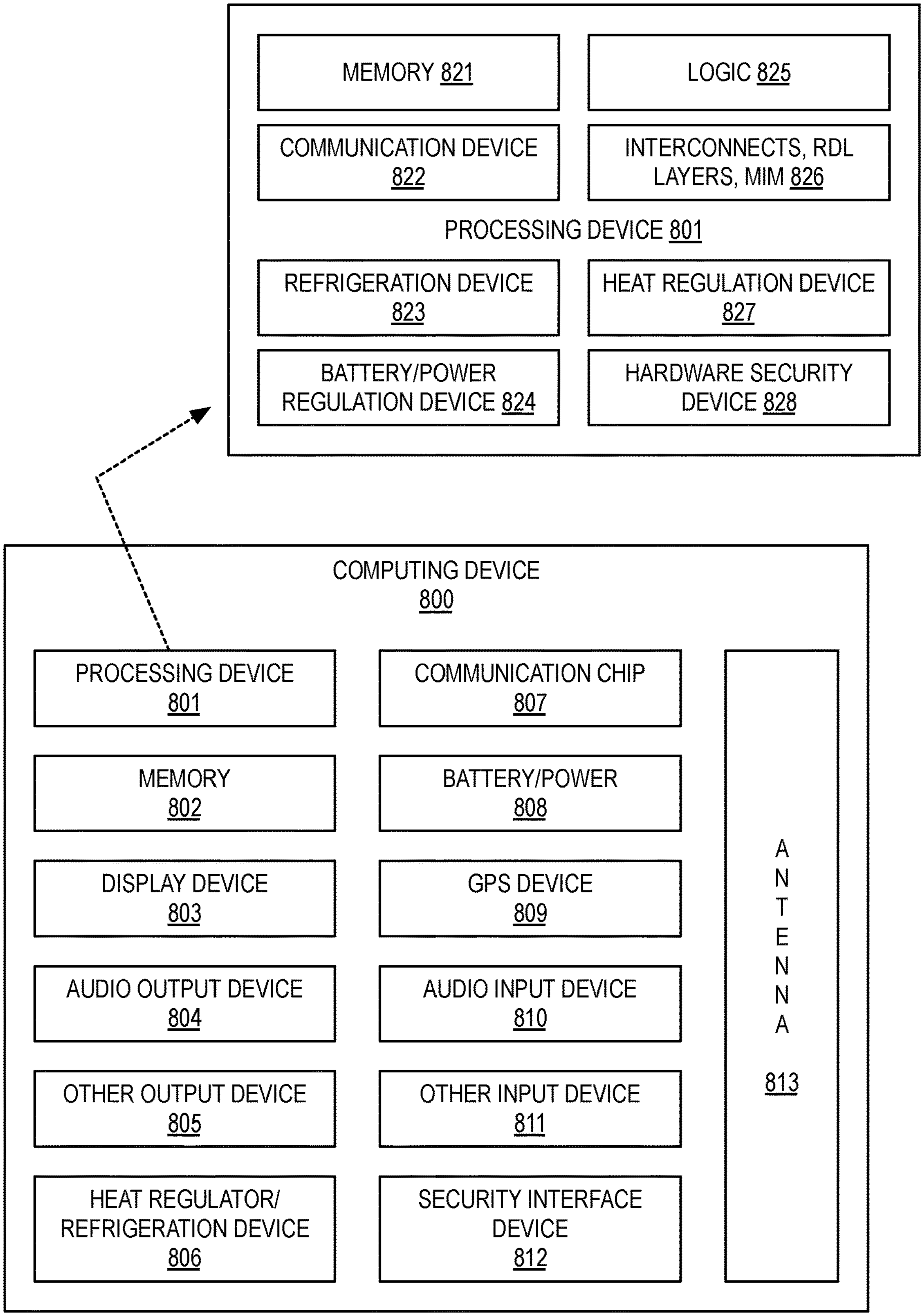

FIG. 8

PROGRAMMABLE CAPACITOR MEMORY ARRAYS WITH STACKED ACCESS TRANSISTORS

BACKGROUND

Memory performance and cost pressures drive a continuous and ever-increasing demand for denser, cheaper, more stable, and less volatile memory devices. Density improvements in ferroelectric random-access memory (FeRAM) devices could readily improve and enable larger and more complex devices. For example, system performance can be improved by using denser FeRAM in place of other less-dense or more-volatile memory devices. More complex systems can be made better or less expensive with denser and cheaper FeRAM.

Structures and methods are needed to improve FeRAM devices and the larger systems in which the FeRAM devices are deployed. It is with respect to these and other considerations that the present improvements have been needed. Such improvements may become critical as the desire to improve FeRAM become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings:

FIG. 8 is a block diagram of an example computing device, all in accordance with some embodiments.

DETAILED DESCRIPTION

Figure 1A:
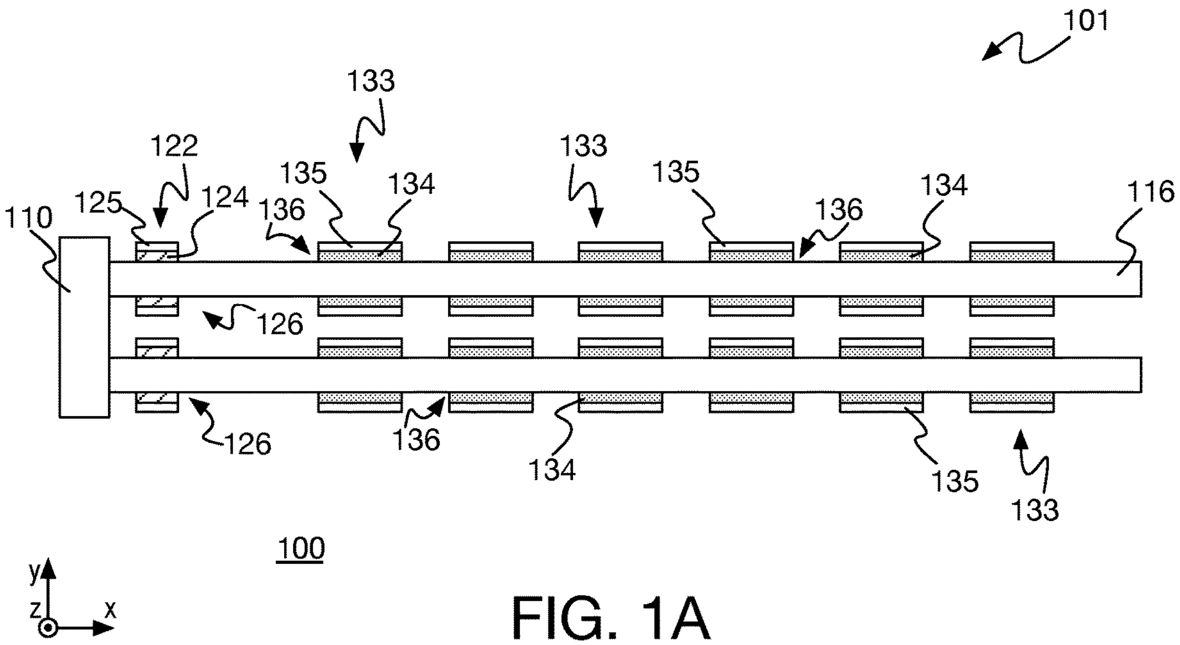
FIGS. 1A, 1B, 1C, and 1D illustrate cross-sectional plan and profile views, an isometric view, and a schematic view of an integrated circuit (IC) die, including an array of capacitors in a memory device.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter.

References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and recitations of "top," "bottom," "above," and "below" refer to relative positions in the z-dimension with the usual meaning. However, embodiments are not necessarily limited to the orientations or configurations illustrated in the figure. The term "aligned" (i.e., vertically or laterally) indicates at least a portion of the components are aligned in the pertinent direction while "fully aligned" indicates an entirety of the components are aligned in the pertinent direction.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified, the use of the ordinal adjectives "first," "second," and "third," etc., to describe a common object, merely indicate that different instances of like objects to which are being referred and are not intended to imply that the objects so described must be in a given sequence, either temporally, spatially, in ranking, or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed to improve the density of ferroelectric random-access memory (FeRAM) devices. FeRAM devices store data in ferroelectric capacitors. FeRAM density can be increased by storing multiple bits per access transistor, e.g., by connecting multiple storage capacitors to a single transistor, and by sharing capacitor plates among multiple capacitors. FeRAM density can be increased further still by increasing component densities with decreased component sizes. Small access transistors with narrow channels within nanowires or nanosheets can be stacked tightly and with small pitches. Gate electrodes can be shared between access transistors within a same word. Nanowires or nanosheets used as channels can also be shared by multiple capacitors as a common first plate with multiple second plates, e.g., wrapping around the common, inner plate. Advantageously, system temperatures can be reduced to increase conductances and reduce leakage currents, thereby enabling still smaller component sizes.

Figure 1B:
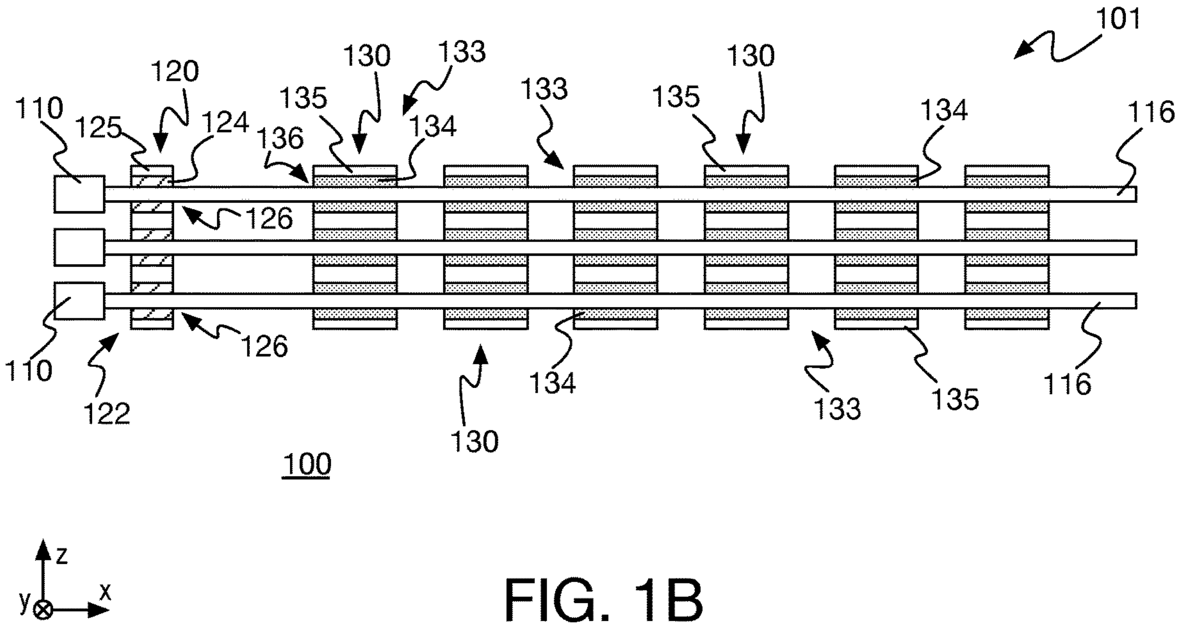
Figure 1C:
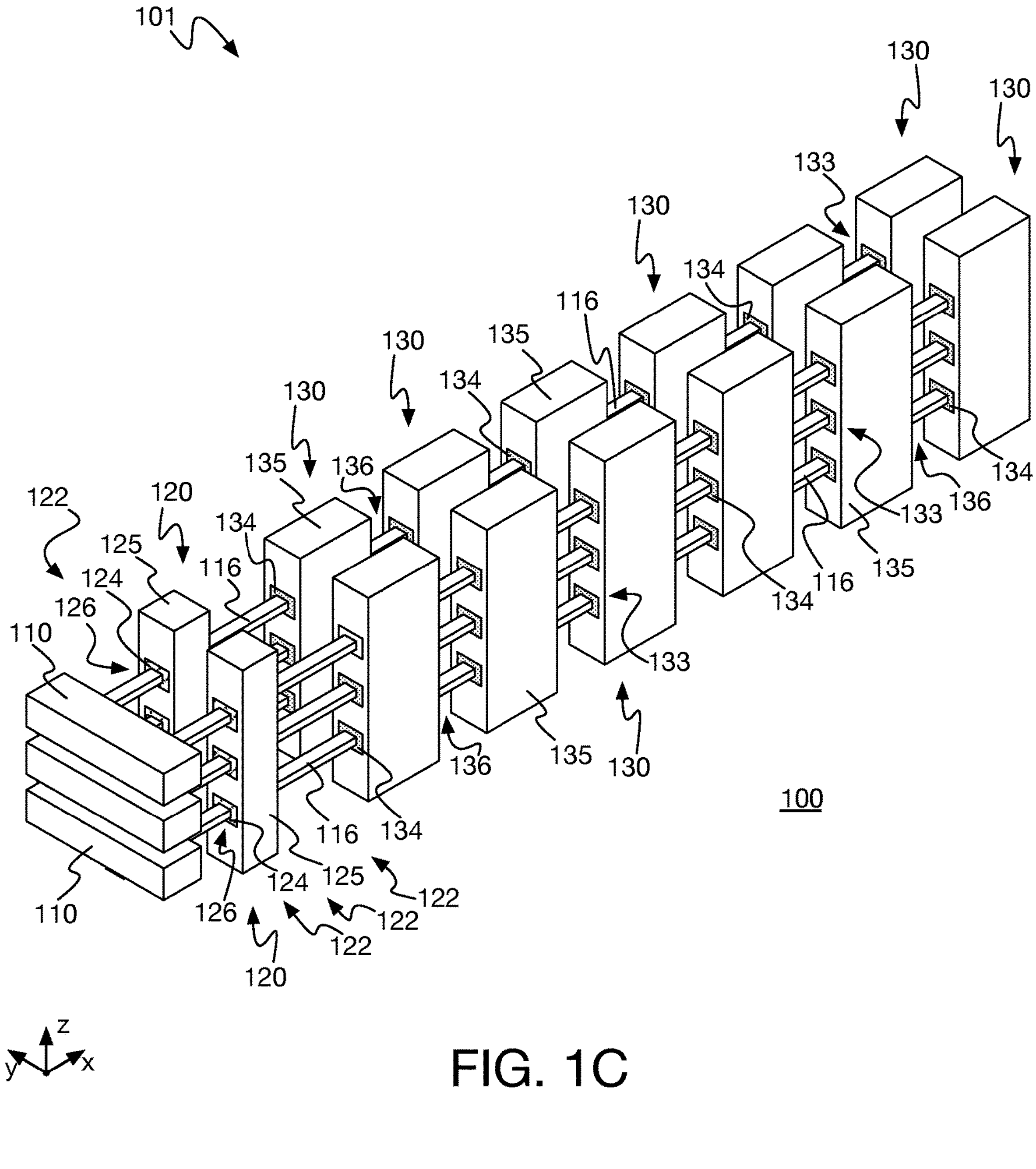
Figure 1D:
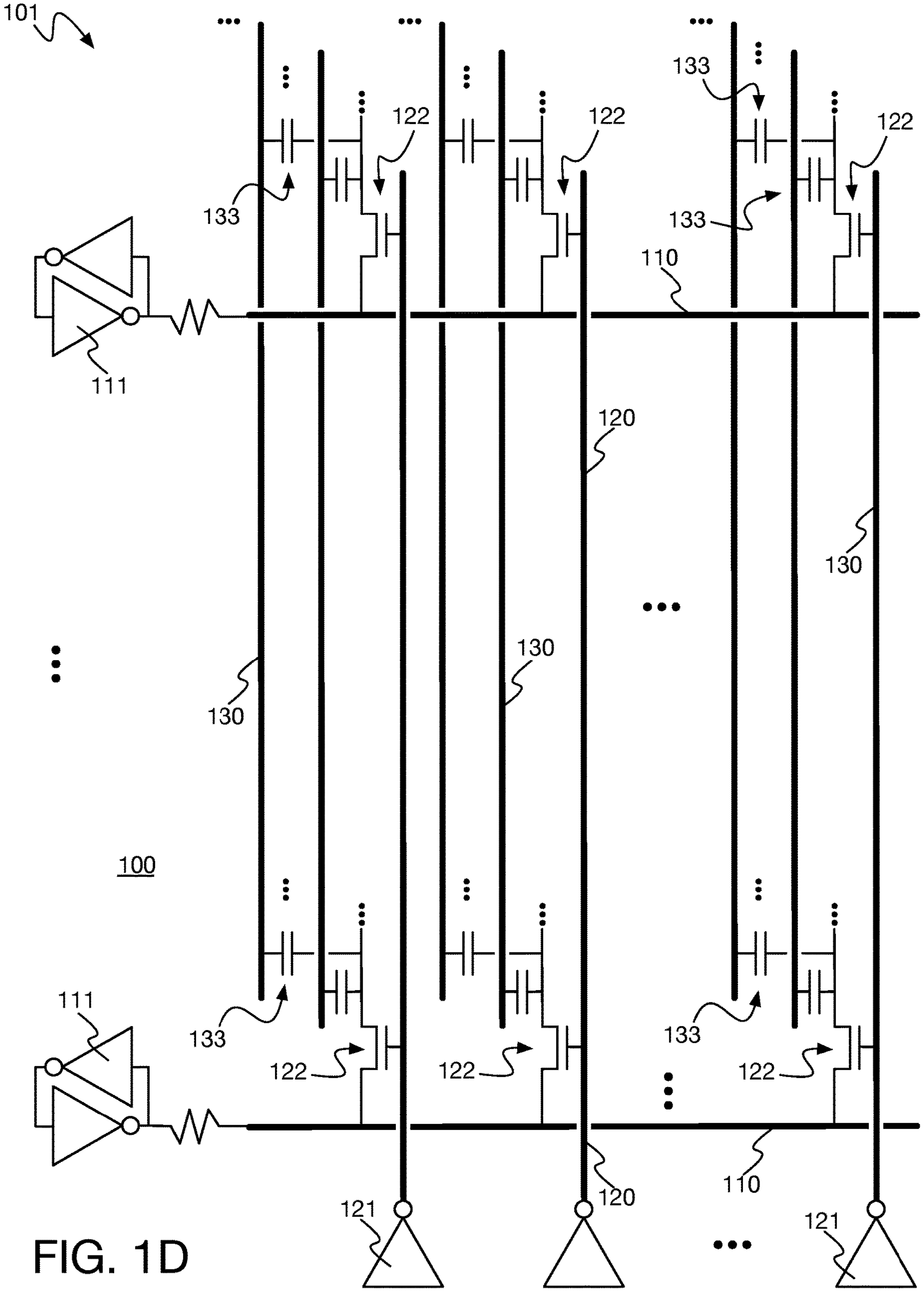

FIGS. 1A, 1B, 1C, and 1D illustrate cross-sectional plan and profile views, an isometric view, and a schematic view of an integrated circuit (IC) die 100, including an array of capacitors 133 in a memory device 101, in accordance with some embodiments. Memory device 101 may be in a multi-functional IC die 100 as part of a larger IC system, or memory device 101 may be in a dedicated memory IC die 100 in a larger IC system. The memory device 101 may be coupled to a power supply through a substrate, such as a larger IC die, interposer, package substrate, or board, in an IC system. In FIG. 1A, an array of capacitors 133 is seen from above in a cross-sectional plan view. A bitline 110 is orthogonal and electrically connected to multiple, parallel nanowires or nanosheets 116. The cross-sectional profile view of FIG. 1B shows that the array has capacitors 133 extending in all three dimensions, including capacitors 133 coupled to bitlines 110 and nanowires or nanosheets 116 below the top capacitors 133. FIG. 1C shows an isometric view of memory device 101 and its array of capacitors 133. FIG. 1D shows a schematic view of a similar memory device 101.

FIG. 1A illustrates FeRAM memory device 101 with multiple storage capacitors 133 coupled to each of multiple nanowires or nanosheets 116. Each capacitor 133 has a ferroelectric layer 134 between two plates, a common plate 136 and an independent plate 135. The first capacitor plate, common plate 136, is a portion of the common capacitor plate region of a nanowire or nanosheet 116. All of capacitors 133 coupled to a given nanowire or nanosheet 116 share common plate 136, having a portion as the first capacitor plate of their two plates. Each capacitor 133 has an independent second capacitor plate, independent plate 135, as the second capacitor plate of their two plates. In some embodiments, the independent second capacitor plates surround the nanowire or nanosheet 116 and the corresponding common plates 136, i.e., that portion of the common capacitor plate region. For example, in FIG. 1A, nanowires or nanosheets 116 are parallel, aligned in the x direction, and each independent plate 135 encircles their corresponding nanowire or nanosheet 116 in the y-z plane, orthogonal to nanowire or nanosheet 116. The independent plates 135 are outer plates around a shared inner plate, common plate 136.

Between each common plate 136 and independent plate 135 is ferroelectric layer 134, which includes a ferroelectric material, which may be characterized as a ferroelectric dielectric material. Ferroelectric layer 134 may include any suitable ferroelectric material. As used herein, the term ferroelectric material indicates a material that has a spontaneous electric polarization that may be controlled by the application of an external electric field. In some embodiments, ferroelectric layer 134 includes lead, zirconium, titanium, and oxygen (e.g., lead zirconium titanate, $PbZr_xTi_{1-x}O_3$, (PZT)). PZT and materials like it, e.g., similar perovskites, may be ultra-scalable and ultra-low voltage. In some embodiments, ferroelectric layer 134 includes barium, titanium, and oxygen (e.g., barium titanate, $BaTiO_3$). In some embodiments, ferroelectric layer 134 includes lead, titanium, and oxygen (e.g., lead titanate, $PbTiO_3$). In some embodiments, ferroelectric layer 134 includes barium, strontium, titanium, and oxygen (e.g., barium strontium titanate, $BaSrTiO_3$). Other ferroelectric materials may be employed.

Advantageously, the ferroelectric material of ferroelectric layer 134 is a material that may be deposited conformally and to very narrow thicknesses, such as a two-dimensional (2D) material. Such is the case with numerous oxides of hafnium or similar metals. In some embodiments, the ferroelectric material of ferroelectric layer 134 includes hafnium, zirconium, and oxygen (e.g., hafnium zirconium oxide, $Hf_{1-x}Zr_xO_2$). In some such embodiments, the ferroelectric material of ferroelectric layer 134 includes dopants, e.g., titanium or niobium. In some embodiments, the ferroelectric material of ferroelectric layer 134 includes hafnium, titanium, and oxygen (e.g., hafnium titanium oxide, $Hf_{1-x}Ti_xO_2$). In some embodiments, the ferroelectric material of ferroelectric layer 134 includes hafnium, scandium, and oxygen. In some embodiments, the ferroelectric material of ferroelectric layer 134 includes zirconium and oxygen (e.g., zirconium dioxide, $ZrO_2$) In some embodiments, the ferroelectric material of ferroelectric layer 134 includes niobium and oxygen. Other ferroelectric materials may be employed.

The use of 2D ferroelectric materials allows for arrays with smaller capacitors and increased memory density. In some embodiments, capacitors 133 have a ferroelectric material thickness of 7 nm or less. Smaller capacitors enable increased memory density. In some embodiments, capacitors 133 have a ferroelectric material thickness of not more than 0.5 nm.

Ferroelectric materials exhibit a hysteresis such that when a positive voltage is applied, a positive residual charge is maintained even as the voltage falls to zero. This residual charge is characterized as polarization. To remove the polarization, a negative voltage must be applied. Furthermore, the negative voltage may be used to provide a negative polarization, which is also maintained as the voltage again goes to zero. In capacitors 133, and other capacitor structures discussed herein, a differential voltage must be applied across the ferroelectric capacitor to polarize ferroelectric layer 134 (i.e., the ferroelectric material) either positively or negatively. This positive or negative polarity may then be read as 1 or 0.

A capacitor with a higher relative permittivity can have smaller plate dimensions for the same capacitance value. Ferroelectric layer 134 advantageously includes a ferroelectric material with a higher relative permittivity than high-K dielectric materials that lack the spontaneous polarization of materials in a ferroelectric phase. For example, a high-k dielectric comprising predominantly hafnium and oxygen ($HfO_x$), but not in a ferroelectric phase, may have a relative permittivity in the range of 10-14. However, hafnium oxide in a ferroelectric phase (e.g., with a orthorhombic or tetragonal, non-centrosymmetric crystalline structure) may have a relative permittivity exceeding 25 (e.g., 30). Although in both instances the $HfO_x$ comprises predominantly hafnium and oxygen, the ferroelectric material of ferroelectric layer 134 is more specifically a ferroelectric phase of the hafnium oxide. Such phases may be achieved, for example, through the addition of a dopant, such as niobium, titanium, silicon, germanium, aluminum, yttrium, etc. Although doped ferroelectric $HfO_x$ is an exemplary embodiment that can be advantageously conformally deposited by atomic layer deposition (ALD), ferroelectric layer 134 may also have other compositions similarly amenable to being deposited at temperatures compatible with, e.g., back-end-of-line (BEOL) structures and with similar thickness conformality.

All of the nanowires or nanosheets 116 are parallel to each other, and nanowires or nanosheets 116 are orthogonal and electrically connected to bitline 110. Each nanowire or nanosheet 116 includes a common capacitor plate region and a channel region. A channel region is part of each nanowire or nanosheet 116, as well as being part of a non-planar transistor 122, a transistor channel 126. Transistor channel 126, the channel portion or region, is between bitline 110 and the common capacitor plate region, so non-planar transistor 122 serves as an access (or select) transistor that controls the electrical connection between bitline 110 and common plate 136. Each non-planar transistor 122 includes a gate structure in contact with the channel portion or region of nanowire or nanosheet 116, transistor channel 126. The gate structure includes at least gate electrode 125 and gate dielectric 124. The conduction of non-planar transistor 122 is controlled by a control voltage on gate electrode 125, which is how bitline 110 is electrically connected to or disconnected from common capacitor plate region and common plate 136.

Gate dielectric 124 is an insulator between gate electrode 125 and transistor channel 126 such that the gate structure is in contact with transistor channel 126, but the control signal on gate electrode 125 is not electrically connected through to transistor channel 126. With gate dielectric 124 as part of the gate structure, an electric field with strength proportional to the control voltage on gate electrode 125 modulates conduction through transistor channel 126. Gate dielectric 124 may have multiple layers. The one or more layers of gate dielectric 124 may include silicon oxide, silicon dioxide ($SiO_2$), and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in gate dielectric 124 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Gate electrode 125 can be of any material suitable for controlling current through transistor channel 126, e.g., a metal for establishing the gate field. Gate electrode 125 may include one layer or a stack of layers. Gate electrode 125 is on gate dielectric 124 and may include of at least one of a p-type work function metal or an n-type work function metal, depending on whether the transistor is, e.g., a PMOS or an NMOS transistor. In some embodiments, gate electrode 125 is a stack of two or more metal layers, where one or more metal layers are work function metal layers and at least one metal layer is a fill metal layer. In some embodiments, gate electrode 125 includes titanium and nitrogen. In some embodiments, gate electrode 125 includes tantalum and nitrogen. In some embodiments, gate electrode 125 includes tungsten. In some such embodiments, gate electrode 125 includes tungsten and nitrogen. In some embodiments, gate electrode 125 includes cobalt or ruthenium. In some embodiments, gate electrode 125 includes molybdenum.

Nanowires or nanosheets 116 can be of any suitable material. Advantageously, nanowires or nanosheets 116 are sufficiently conductive to allow for, e.g., the conduction of non-planar transistors 122 and the flow and collection of charge on common plates 136 of capacitors 133. In some embodiments, nanowires or nanosheets 116 include silicon. Nanowires or nanosheets 116 can be doped to, e.g., increase electrical conductivity. A nanowire or nanosheet 116 (and its constituent channel portion) can include a dopant of either polarity and so make transistor channel 126 of either type, p- or n-type. The concentration of the dopant can vary along the length of nanowire or nanosheet 116. In some embodiments, the common capacitor plate region has a concentration of the dopant greater than a concentration of the dopant in the channel region. That is, in some examples, common plate 136 has a greater dopant concentration than transistor channel 126.

Nanowires or nanosheets 116 can be any suitable size. Nanowires or nanosheets 116 and transistor channels 126 with smaller thicknesses can be used to increase memory density, e.g., to make arrays smaller for a constant number of bits. In some embodiments, nanowires or nanosheets 116 and transistor channels 126 have a thickness of not more than 2 nm. In some embodiments, nanowires or nanosheets 116 and transistor channels 126 have a thickness of not more than 1 nm. Materials with high conductivities, including those doped to have high conductivities, may be used to allow for reduced dimensions, e.g., channel thicknesses. Cooling systems may be thermally coupled to the IC system to reduce operating temperatures and enhance conductivities. In some embodiments, the IC system includes or is thermally coupled to a cooling structure that can reduce the operating temperature to −25° C. In some such embodiments, the cooling structure can reduce the operating temperature to 77K.

FIG. 1B illustrates the array of capacitors 133 further in a cross-sectional profile view of memory device 101 and IC die 100. FIG. 1B shows that the array of capacitors 133 extends in all three dimensions with capacitors 133 also coupled to more bitlines 110 and nanowires or nanosheets 116 below those seen from the top view of FIG. 1A. Some of the structures previously seen in the top level are connected to similar structures in the duplicated levels below. For example, a group of platelines 130 connect the independent second capacitor plates of each capacitor 133, independent plates 135, to independent plates 135 of capacitors 133 below. The top gate electrode 125 of the top non-planar transistor 122 is connected to vertically aligned gate electrodes 125 below by a wordline 120 in an integrated gate structure. Non-planar transistors 122 are stacked tightly, one over the other, which is enabled by the narrow channel regions of nanowires or nanosheets 116.

Wordline 120 is parallel to platelines 130. Wordline 120 electrically connects vertically aligned gate electrodes 125. In FIG. 1B, wordline 120 physically connects gate electrodes 125 into a shared, integrated gate structure. In other embodiments, wordline 120 electrically and physically connects distinct gate electrodes 125 in a common word group. As discussed, the conduction of non-planar transistor 122 is controlled by a voltage on gate electrode 125 and the consequent gate field. These select transistors and their conduction control the flow of bits from storage capacitors 133 to corresponding bitlines 110 by way of nanowires or nanosheets 116. Wordlines 120 deliver the control voltages to gate electrodes 125 to access the bits from a given word group. Capacitors 133 are coupled to a shared nanowire or nanosheet 116 and common plate 136, i.e., with a common capacitor plate region, also share an access transistor, non-planar transistor 122, and so can store bits in a same word group. Their bits are accessed by the same wordline 120. Word lengths can be made longer by connecting more access transistors. Capacitors 133 coupled to other nanowires or nanosheets 116 and so without a common capacitor plate region can also share a same wordline 120 and so store bits in a same word group. The bits stored in a same word group and selected by a same wordline 120 but in capacitors 133 coupled to other nanowires or nanosheets 116 will be read to, or written from, different bitlines 110, e.g., simultaneously and in parallel.

Each capacitor 133 is accessed by a unique combination of bitline 110, wordline 120, and plateline 130, and the memory array and its constituent bits can be programmed using signals on these lines. Capacitors 133 coupled to a shared nanowire or nanosheet 116 and common plate 136 are connected to different platelines 130. The group of platelines 130 are parallel to each other and parallel to wordline 120. Platelines 130 are coupled and electrically connected to a group of the independent second capacitor plates of capacitors 133, connecting independent plates 135 of capacitors 133 on different nanowires or nanosheets 116 and coupled to different bitlines 110 through different access transistors. In FIG. 1B, platelines 130 physically connect independent plates 135 into an integrated plate structure such that platelines 130 include multiple independent plates 135. The independent plates 135 are outer plates around a shared inner plate, common plate 136 (where the sharing is with other outer plates on a same nanowire or nanosheet 116 and with different platelines 130). The separate platelines 130 for independent plates 135 with a shared common plate 136 (and access transistor) allow for independent control of individual capacitors 133 and their stored bits. When a given combination of wordline 120 and plateline 130 is used to access a corresponding capacitor or capacitors 133, only one stored bit will be connected to any given bitline 110. In FIG. 1B, a given combination of wordline 120 and plateline 130 corresponds to multiple capacitors 133, but those capacitors 133 are each connected to a corresponding bitline 110 and each by a different nanowire or nanosheet 116.

The side view of FIG. 1B shows that there is a group of bitlines 110 at different levels, one above the other along wordline 120. Bitlines 110 are parallel to each other and extend in the y direction, while wordlines 120 extend in the z direction and are orthogonal to bitlines 110. Each nanowire or nanosheet 116 is connected to a single bitline 110 with an access transistor controlling the electrical connection of a common capacitor plate region to a corresponding bitline 110 by an intervening channel region. Each bitline 110 is coupled to one end of a corresponding transistor channel 126, and the other end of transistor channel 126 is coupled to a corresponding first capacitor plate, a shared common plate 136, of a group of capacitors 133.

The isometric view of FIG. 1C further illustrates the three-dimensional nature of the array of capacitors 133 and the spatial relationships between the constituent structures of memory device 101 and IC die 100. The duplicate, second row of structures, i.e., the back row seen deeper in the y direction, is more visible in isometric view.

Parallel nanowires or nanosheets 116 extend in the x direction, which is orthogonal to all of bitlines 110, wordlines 120, and platelines 130. Each nanowire or nanosheet 116 includes a channel region and a common capacitor plate region. The channel region is also part of an access transistor. This channel portion is transistor channel 126 in non-planar transistor 122. The channel region is between bitline 110 and common capacitor plate region. The common capacitor plate region is the part of nanowire or nanosheet 116 shared by the group of capacitors 133, away from bitline 110, beyond transistor channel 126. This shared inner plate, common plate 136, is radially surrounded by a group of independent second capacitor plates, independent plates 135, which are outer plates. A ferroelectric layer 134, which includes a ferroelectric material, is between independent plates 135 and common plate 136. These groups of capacitors 133 make up an array of capacitors 133, a group for each one of the groups of parallel nanowires or nanosheets 116.

Multiple wordlines 120 are parallel to each other and parallel to platelines 130. Wordlines 120 extend in the z direction, which is orthogonal to the bitlines 110, which extend in the y direction. Wordlines 120 are electrically connected and coupled to groups of gate electrodes 125. Gate electrodes 125 are part of gate structures, which also include gate dielectrics 124. The gate structures are part of non-planar transistors 122, and each gate structure contacts a corresponding transistor channel 126. As seen in FIG. 1C, access non-planar transistors 122 are packed closely together, and each wordline 120 physically connects corresponding gate electrodes 125 into shared, integrated gate structures. In an integrated gate structure, an individual gate structure for a given non-planar transistor 122 includes its gate dielectric 124 and the gate electrode 125 contacting gate dielectric 124.

As discussed, the group of bitlines 110 are orthogonal and electrically connected to nanowires or nanosheets 116. Bitlines 110 are each coupled to one end of a corresponding transistor channel 126, with the other end of transistor channel 126 coupled to the corresponding shared inner plate, common plate 136. The channel region is between bitline 110 and the common capacitor plate region, which forms the first capacitor plates.

Platelines 130 couple and are electrically connected to a group of the second capacitor plates, independent plates 135. In some embodiments, as is seen in FIG. 1C, platelines 130 are parallel to wordlines 120 and include the outer plates, independent plates 135, in an integrated structure. The outer plates, independent plates 135, are considered to be at least that part of the integrated structure in contact with the ferroelectric material of ferroelectric layer 134. Platelines 130 are orthogonal to nanowires or nanosheets 116, and independent plates 135 each surround their corresponding nanowire or nanosheet 116 in a plane orthogonal to that nanowire or nanosheet 116.

As described, each capacitor 133 is accessed by a unique combination of bitline 110, wordline 120, and plateline 130. Such access is more easily understood in the isometric view of FIG. 1C. In FIG. 1C, a given combination of wordline 120 and plateline 130 corresponds to multiple capacitors 133, but those capacitors 133 are each connected to a corresponding bitline 110 and each by a different nanowire or nanosheet 116. For the example seen in FIG. 1C, a single wordline 120 and a single plateline 130 in the same word, i.e., connected to the independent plates 135 coupled to the same three nanowires or nanosheets 116 (and common plates 136) as the given wordline 120, could reference one, e.g., the $1^{st}$ or $0^{th}$, bit from each nanowire or nanosheet 116 to deliver to the corresponding three bitlines 110.

FIG. 1D illustrates capacitors 133 in memory device 101 in IC die 100 with a schematic view that, although it cannot precisely represent the physical layout, can help show the organization of the device components electrically. As with the physical layout shown in FIG. 1C, platelines 130 are parallel to wordlines 120, and bitlines 110 extend in a direction orthogonal to wordlines 120 and platelines 130. More wordlines 120 are shown in the schematic than in FIG. 1C, and ellipses throughout indicate that yet more wordlines (and other components and structures) are not shown or can be included in an arbitrarily large system. Driver circuits, such as bitline drivers 111 and wordline drivers 121, help source currents and maintain voltage levels as desired. The gates of non-planar transistors 122 are electrically connected to wordlines 120, which control the access transistors to electrically connect (or not) bitlines 110 to storage capacitors 133.

The physical layout of nanowires or nanosheets 116 (and their corresponding groups of capacitors 133) and their relationships to other components cannot be accurately shown by this schematic view. Nanowires or nanosheets 116 are represented by the channel portions of the schematic symbols for non-planar transistors 122, as well as the lines connected to both non-gate terminals of non-planar transistors 122. The vertical electrical lines below non-planar transistors 122 represent the portions of nanowires or nanosheets 116 connecting bitlines 110 to the non-planar transistor 122 channels. The vertical electrical lines above non-planar transistors 122 represent the common capacitor plate regions of nanowires or nanosheets 116. Here again, the schematic view cannot portray the physical layout of the structures of memory device 101. The schematic symbols for capacitors 133 are flat, parallel plates, which are electrically connected on one side to vertical electrical lines above non-planar transistors 122. These distinct capacitor plates are physically realized together as a shared inner plate, each a common capacitor plate region of a nanowire or nano sheet 116. The other plates are the second, independent plates that surround a nanowire or nano sheet 116 as outer plates.

FIGS. 2A, 2B, 2C, and 2D illustrate cross-sectional plan and profile views, an isometric view, and a schematic view of an IC die 100, including an array of capacitors 133 in a memory device 101, in accordance with some embodiments. Memory device 101 is similar to the devices described in FIGS. 1A-1D, but the group of bitlines 110 are all parallel to the groups of platelines 130. Although platelines 130 are not parallel to wordlines 120 in this embodiment, each capacitor 133 can still be accessed with a unique combination of bitline 110, wordline 120, and plateline 130.

Figure 2A:
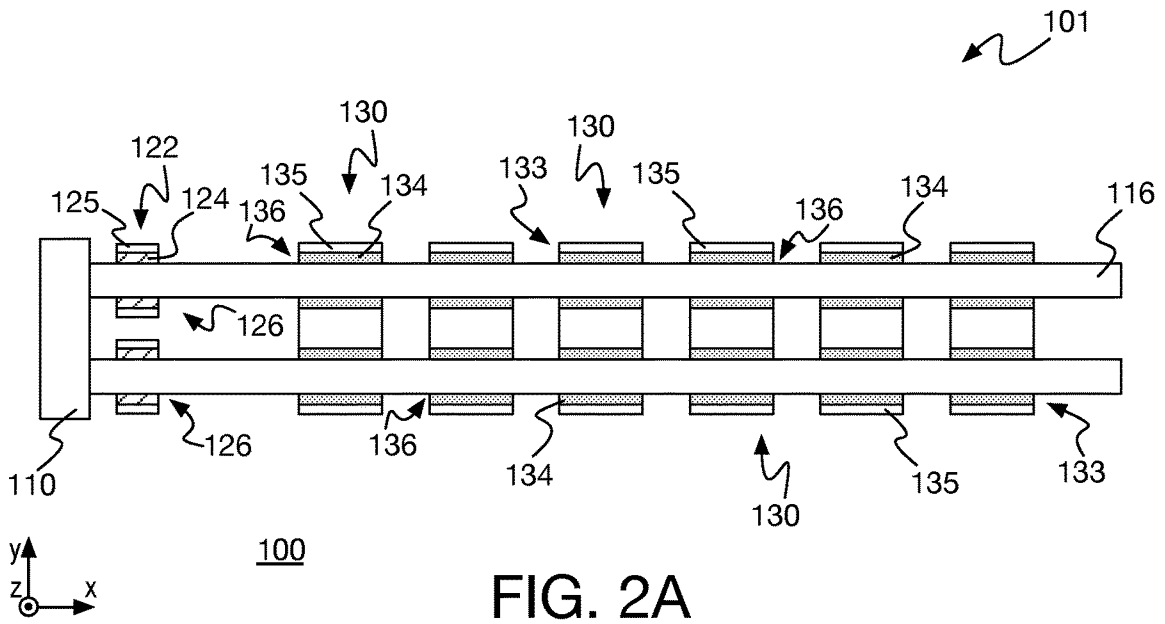
FIGS. 2A, 2B, 2C, and 2D illustrate cross-sectional plan and profile views, an isometric view, and a schematic view of an IC die, including an array of capacitors in a memory device.
Figure 2B:
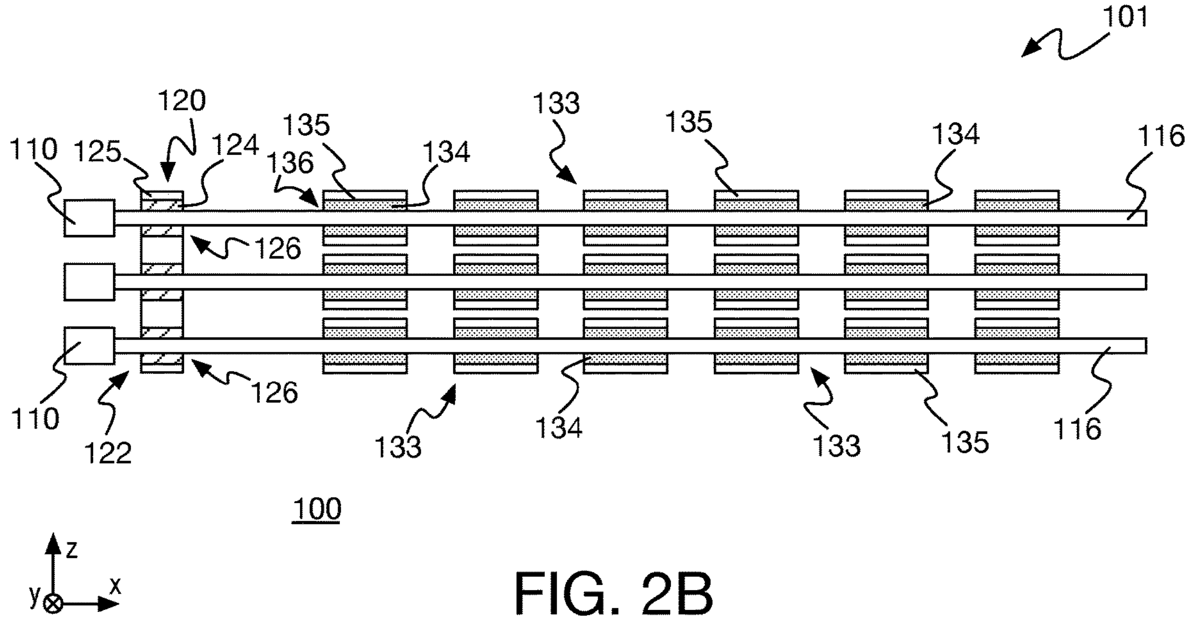
Figure 2C:
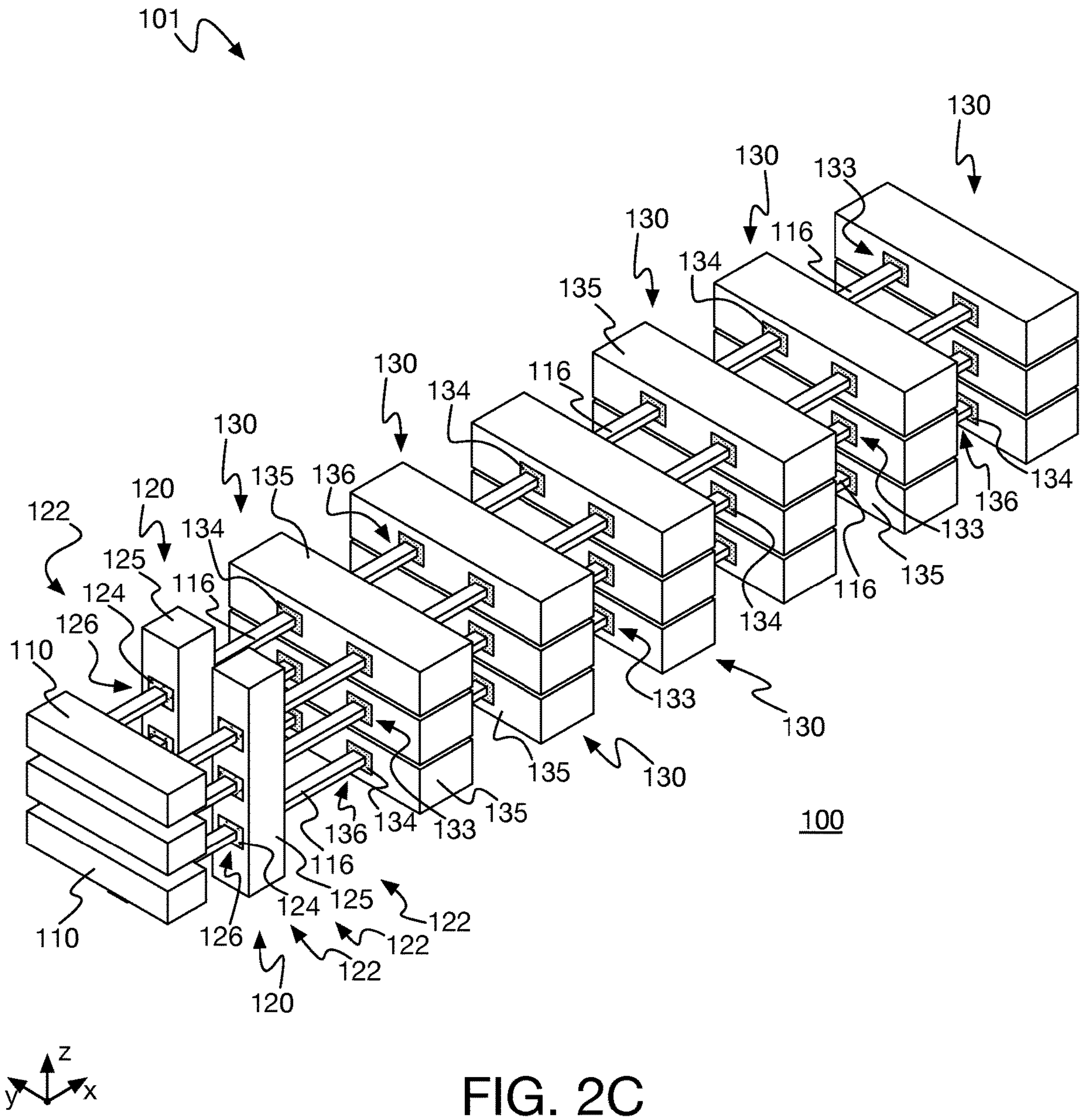

As shown in FIGS. 2A, 2B, and 2C, bitline 110 is orthogonal and electrically connected to a group of parallel nanowires or nanosheets 116. In this embodiment, platelines 130 are parallel to bitlines 110, both groups extending in the y direction, and platelines 130 and wordlines 120 are not parallel, as wordlines 120 extend in the z direction. The same or similar bitlines 110 are coupled to the same or similar transistor channels 126, whose other ends are coupled to the same or similar common plates 136. That is, the nanowires or nanosheets 116 include channel regions and common capacitor plate regions, and the channel regions are between the same or similar bitlines 110 and the common capacitor plate regions. The same or similar wordlines 120 are coupled to the same or similar gate structures, which are in contact with those same or similar transistor channels 126, which electrically connect (or disconnect) the same or similar bitlines 110 to the same or similar common plates 136. The same or similar common plates 136 (and common capacitor plate regions) are coupled to the same or similar capacitors 133, which make up the same or similar array of capacitors 133.

However, the access of bits differs now with the change to platelines 130. As described, each capacitor 133 is accessed by a unique combination of bitline 110, wordline 120, and plateline 130. The change of access is seen in the isometric view of FIG. 2C. In FIG. 2C, a given combination of wordline 120 and plateline 130 corresponds to only one of the shown capacitors 133. For the example seen in FIG. 1C, a single wordline 120 and three platelines 130 referencing parts of the same word, i.e., connected to the independent plates 135 coupled to the same three nanowires or nanosheets 116 (and common plates 136) as the given wordline 120, could reference one, e.g., the $1^{st}$ or $0^{th}$, bit from each of the three nanowires or nanosheets 116 to deliver to the corresponding three bitlines 110.

Figure 2D:
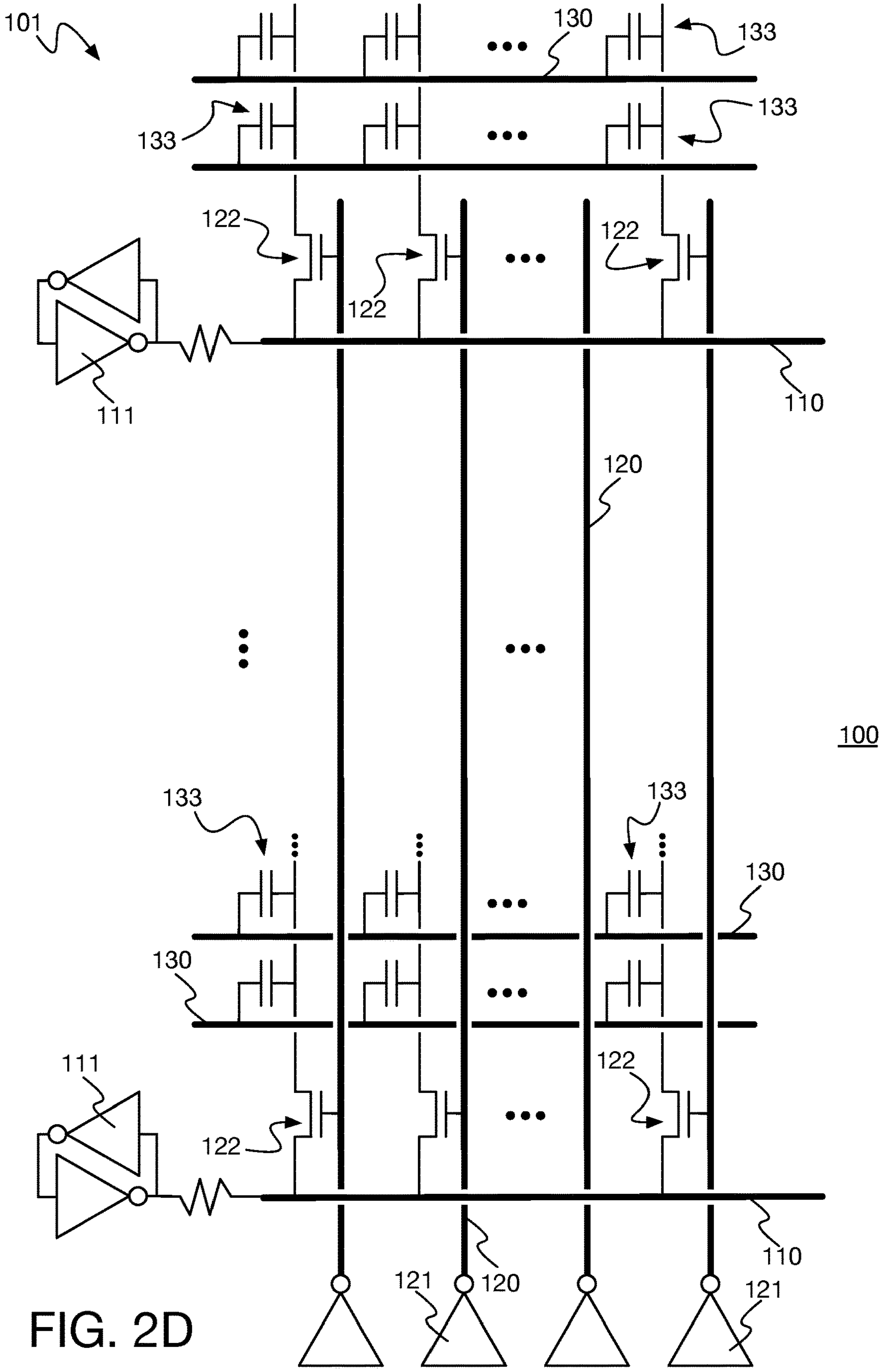

FIG. 2D illustrates a corresponding array of capacitors 133 in memory device 101 in IC die 100 with a schematic view. Platelines 130 are parallel to bitlines 110, and wordlines 120 extend in a direction orthogonal to that of bitlines 110 and platelines 130. Ellipses throughout indicate that more components and structures are not shown or can be included in an arbitrarily large system. Bitline drivers 111 and wordline drivers 121 source currents and maintain voltage levels. The orthogonal signals of wordlines 120 (on the gates of non-planar transistors 122) and platelines 130 (on the independent, outer, second plates of capacitors 133) control the electrical connection of bitlines 110 to storage capacitors 133 and the access to their bits.

Figure 3A:
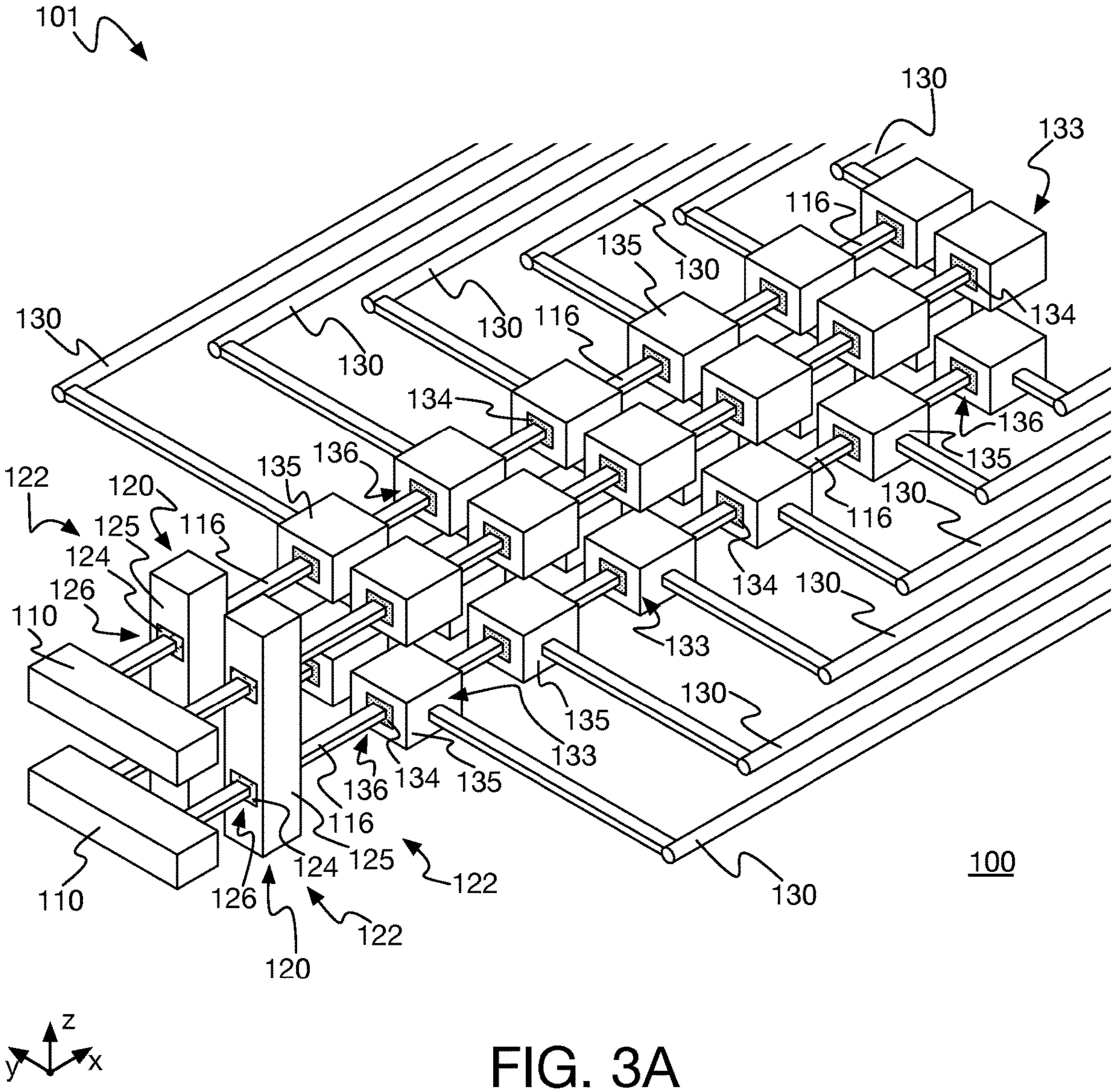
FIGS. 3A and 3B illustrate isometric and schematic views of an IC die, including an array of capacitors in a memory device.
Figure 3B:
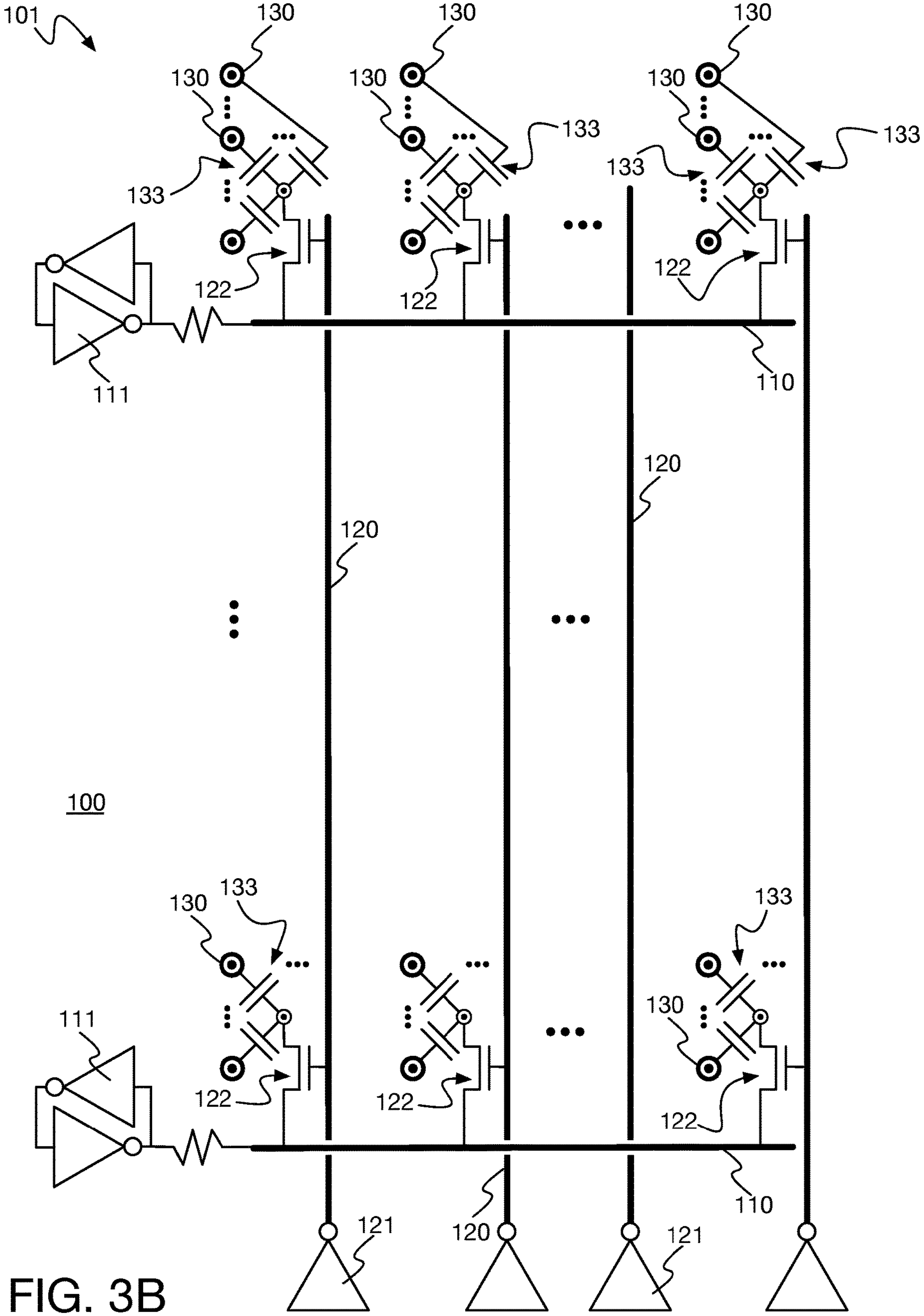

FIGS. 3A and 3B illustrate isometric and schematic views of an IC die 100, including an array of capacitors 133 in memory device 101, in accordance with some embodiments. Memory device 101 is similar to the devices described in FIGS. 2A-2D, but platelines 130 in FIG. 3A extend in the x direction outside of the array, orthogonal to the directions of bitlines 110 and wordlines 120. Platelines 130 are parallel and in a plane with connected and horizontally aligned nanowires or nanosheets 116. This routing option, e.g., outside of some arrays or portions of some arrays, may be advantageous in some situations. Other options are available external to the array. In some embodiments, platelines 130 are parallel and in a plane with connected and vertically aligned nanowires or nanosheets 116. In some embodiments, platelines 130 are parallel to one or more connected nanowires or nanosheets 116 but arranged around the one or more connected nanowires or nanosheets 116. In the example shown in FIG. 3A, capacitors 133 are connected (within the array) to nearby, corresponding capacitors 133 on a horizontally aligned nanowire or nanosheet 116, much like the example of FIG. 2C. Other options are available internal to the array. In some embodiments, capacitors 133 are connected to nearby, corresponding capacitors 133 on a vertically aligned nanowire or nanosheet 116.

Each capacitor 133 can still be accessed with a unique combination of bitline 110, wordline 120, and plateline 130. Access control will vary with the connection scheme. In the example of FIG. 3A, bits are accessed in a manner similar to that described in FIG. 2C.

The schematic view of FIG. 3B illustrates a corresponding array of capacitors 133 in memory device 101 in IC die 100 with limitations similar to those of FIGS. 1C and 2C. Bitlines 110, wordlines 120, and platelines 130 extend in three different directions, each orthogonal to the others. Platelines 130 and common capacitor plate regions are parallel and are shown extending out of the viewed plane. Platelines 130 are arranged around a parallel common capacitor plate region in some examples and in a plane in others. Other arrangements may be used.

Figure 4:
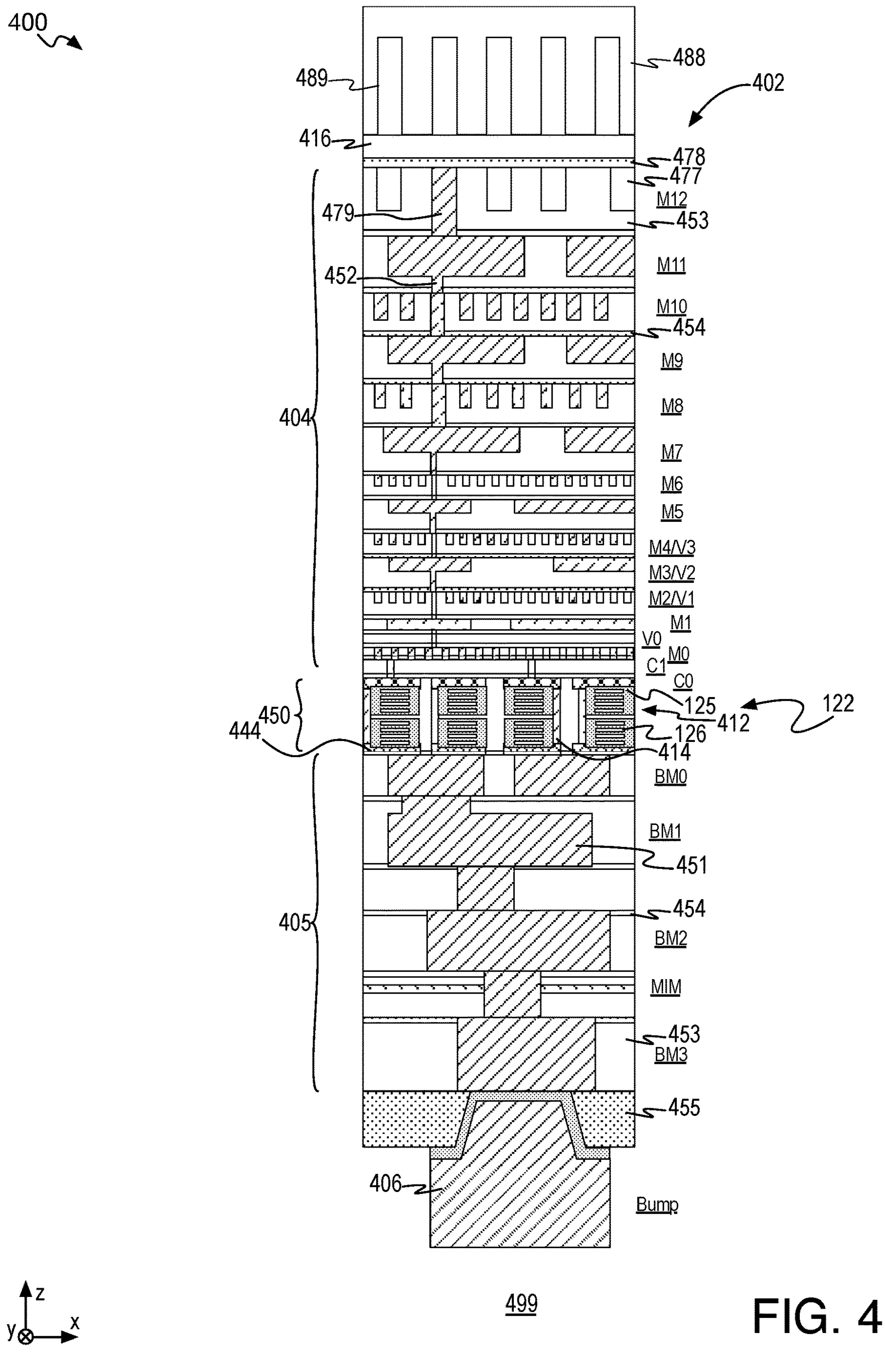
FIG. 4 illustrates a cross-sectional view of a low-temperature IC system having capacitor memory arrays with stacked access transistors and using die- and package-level active cooling.

Small-thickness access transistors and multi-capacitor memory arrays may advantageously be integrated into a low-temperature system, such as that shown in FIG. 4, for improved operation. For example, some suitable materials, such as semiconductor materials, have increased carrier mobility, reduced leakage currents, and reduced contact resistance (e.g., at the interfaces between semiconductor and metal) at low temperatures. Such enhanced conduction can enable the use of, e.g., different materials and structures, such as smaller transistor channels or longer nanosheets or nanowires. In some embodiments, nanosheets or nanowires and access transistor channels as described have a thickness of 2 nm. In some embodiments, nanosheets or nanowires and access transistor channels as described have a thickness of 1 nm. Lower temperatures may also enable the use of smaller capacitors or voltages. Lower temperatures reduce leakage currents in many insulator materials and can enable the use of, e.g., smaller capacitors. In some embodiments, capacitors in an array as described have a ferroelectric material thickness of 7 nm. Smaller capacitors enable increased memory density. In some embodiments, capacitors in an array as described have a ferroelectric material thickness of 0.5 nm.

A number of structures may be used to lower the system temperature and so allow for the use of, e.g., smaller conducting structures. Active cooling structures can be used to lower system temperatures to below ambient temperature, even to well below ambient temperature. Active cooling structures can include thermoelectric coolers. In some embodiments, active cooling structures include stacks of alternating p- and n-type semiconductor materials. In some embodiments, active cooling structures flow cooling fluids through channels, including microchannels, thermally coupled to IC packages. In some embodiments, active cooling structures include channels thermally coupled to IC dies 100. In some embodiments, active cooling structures include channels on one or more sides of IC dies 100. In some embodiments, active cooling structures include channels within IC dies 100. In some embodiments, active cooling structures include two-phase cooling. In some embodiments, active cooling structures include low-boiling-point fluids. In some embodiments, active cooling structures include refrigerants as cooling fluids. In some embodiments, active cooling structures lower system temperatures to 77K or below.

FIG. 4 illustrates a cross-sectional view of a low-temperature, compact, multi-capacitor array IC system 400 using die- and package-level active cooling, in accordance with some embodiments. In the example of IC system 400, IC die 402 includes active-cooling structures or components as provided by both die-level microchannels 477 and package-level active-cooling structure 488. IC system 400 includes a lateral surface along the x-y plane that may be defined or taken at any vertical position of IC system 400. The lateral surface of the x-y plane is orthogonal to a vertical or build-up dimension as defined by the z-axis. In some embodiments, IC system 400 may be formed from any substrate material suitable for the fabrication of transistor circuitry. In some embodiments, a semiconductor substrate is used to manufacture non-planar access transistors with nanowire or nanosheet channels and other transistors and components of IC system 400. The semiconductor substrate may include a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as gallium arsenide. The substrate may also include semiconductor materials, metals, dielectrics, dopants, and other materials commonly found in semiconductor substrates.

In FIG. 4, IC system 400 includes an IC die 402, which is a monolithic IC with multi-capacitor memory arrays as described above, including access by non-planar transistors 122 with nanowire or nanosheet channels, front-side metallization layers 404 (or front-side interconnect layers), and optional back-side metallization layers 405 (or back-side interconnect layers). As shown, access non-planar transistors 122 are transistors embedded within a dielectric layer 450. As shown, each of access non-planar transistors 122 include transistor channels 126 (e.g., within nanoribbons or nanosheets), gate structures 412 (including gate dielectrics), and gate electrodes 125. Each of non-planar transistors 122 also include source and drain structures, and source and drain contacts, which are not shown in the cross-section of FIG. 4. In some embodiments, front-side metallization layers 404 provide signal routing to non-planar transistors 122 and back-side metallization layers 405 provide power delivery, as enabled by through-contacts 414, to non-planar transistors 122. In some embodiments, IC system 400 further includes a package-level cooling structure 488, which may be deployed on or over front-side metallization layers 404 (as shown) or on or over a back-side of IC die 402. In some embodiments, package-level cooling structure 488 is coupled to IC die 402 by an adhesion layer 416. IC system 400 may also be deployed without back-side metallization layers 405 shown in FIG. 4. In such embodiments, signal routing and power are provided to non-planar transistors 122 via front-side metallization layers 404. However, use of back-side metallization layers 405 may offer advantages.

Access non-planar transistors 122 are connected and thermally coupled by metallization, e.g., metal heat spreader 444, to the entire metallization structure by through-contacts 414. In this way, access non-planar transistors 122 are thermally coupled to both the die-level active-cooling structures (of die-level microchannels 477) and package-level active-cooling structure 488.

Interconnectivity of access non-planar transistors 122 (and other transistors, etc.), signal routing to and from capacitor memory arrays, etc., power delivery, etc., and routing to an outside device (not shown), is provided by front-side metallization layers 404, optional back-side metallization layers 405, and package-level interconnects 406. In the example of FIG. 4, package-level interconnects 406 are provided on or over a back-side of IC die 402 as bumps over a passivation layer 455, and IC system 400 is attached to a substrate 499 (and coupled to signal routing to, power delivery, etc.) by package-level interconnects 406. However, package-level interconnects 406 may be provided using any suitable interconnect structures such as bond pads, solder bumps, etc. Furthermore, in some embodiments, package-level interconnects 406 are provided on or over a front-side of IC die 402 (i.e., over front-side metallization layers 404) and package-level cooling structure 488 is provided on or over a back-side of IC die 402 (i.e., adjacent non-planar transistors 122).

In IC system 400, IC die 402 includes die-level, active-cooling as provided by die-level microchannels 477. Die-level microchannels 477 are to convey a heat transfer fluid therein to remove heat from IC die 402. The heat transfer fluid may be any suitable liquid or gas. In some embodiments, the heat transfer fluid is liquid nitrogen operable to lower the temperature of IC die 402 to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term "microchannels" indicates a channel to convey a heat transfer fluid with the multiple microchannels providing discrete separate channels or a network of channels. Notably, the plural microchannels does not indicate separate channel networks are needed. Such die-level microchannels 477 may be provided in any pattern in the x-y plane such as serpentine patterns, patterns of multiple parallel die-level microchannels 477, or the like. Die-level microchannels 477 couple to a heat exchanger (not shown) that removes heat from and cools the heat transfer fluid before re-introduction to die-level microchannels 477. The flow of fluid within die-level microchannels 477 may be provided by a pump or other fluid flow device. The operation of the heat exchanger, pump, etc. may be controlled by a controller.

In the illustrated embodiment, die-level microchannels 477 are implemented at metallization level M12. In other embodiments, die-level microchannels 477 are implemented over metallization level M12. Die-level microchannels 477 may be formed using any suitable technique or techniques such as patterning and etch techniques to form the void structures of die-level microchannels 477 and passivation or deposition techniques to form a cover structure 478 to enclose the void structures. As shown, in some embodiments, the die-level, active-cooling structure of IC system 400 includes a number of die-level microchannels 477 in IC die 402 and over a number of front-side metallization layers 404. As discussed, die-level microchannels 477 are to convey a heat transfer fluid therein. In some embodiments, a metallization feature 479 of metallization layer M12 is laterally adjacent to die-level microchannels 477. For example, metallization feature 479 may couple to a package-level interconnect structure (not shown) for signal routing for IC die 402. In some embodiments, a passive heat removal device such as a heat sink or the like may be used instead of or in addition to package-level cooling structure 488. In some embodiments, package-level cooling structure 488 is not deployed in IC system 400.

As used herein, the term "metallization layer" describes layers with interconnections or wires that provide electrical routing, generally formed of metal or other electrically and thermally conductive material. Adjacent metallization layers may be formed of different materials and by different methods. Adjacent metallization layers, such as metallization interconnects 451, are interconnected by vias, such as vias 452, that may be characterized as part of the metallization layers or between the metallization layers. As shown, in some embodiments, front-side metallization layers 404 are formed over and immediately adjacent non-planar transistors 122. The back-side is then the opposite side, which may be exposed during processing by attaching the front-side to a carrier wafer and exposing the back-side (e.g., by back-side grind or etch operations) as known in the art.

In the illustrated example, front-side metallization layers 404 include M0, V0, M1, M2/V1, M3/V2, M4/V3, and M4-M12. However, front-side metallization layers 404 may include any number of metallization layers such as eight or more metallization layers. Similarly, back-side metallization layers 405 include BM0, BM1, BM2, and BM3. However, back-side metallization layers 405 may include any number of metallization layers such as two to five metallization layers. Front-side metallization layers 404 and back-side metallization layers 405 are embedded within dielectric materials 453, 454. Furthermore, optional metal-insulator-metal (MIM) devices such as diode devices may be provided within back-side metallization layers 405. Other devices such as capacitive memory devices may be provided within front-side metallization layers 404 and/or back-side metallization layers 405.

IC system 400 includes package-level active-cooling structure 488 having package-level microchannels 489. Package-level microchannels 489 are to convey a heat transfer fluid therein to remove heat from IC die 402. The heat transfer fluid may be any suitable liquid or gas as discussed with respect to die-level microchannels 477. Package-level microchannels 489 may be provided in any pattern in the x-y plane such as serpentine patterns, patterns of multiple parallel package-level microchannels 489, etc. Package-level microchannels 489 couple to a heat exchanger (not shown) that removes heat from and cools the heat transfer fluid before re-introduction to package-level microchannels 489. The flow of fluid within package-level microchannels 489 may be provided by a pump or other fluid-flow device. The operation of the heat exchanger, pump, etc. may be controlled by a controller. In the illustrated embodiment, package-level active-cooling structure 488 is a chiller mounted to IC die 402 such that the chiller has a solid body having microchannels therein to convey a heat transfer fluid.

In some embodiments, the heat-removal fluid deployed in die-level microchannels 477 and package-level active-cooling structure 488 are coupled to the same pump and heat exchanger systems. In such embodiments, the heat removal fluid conveyed in both die-level microchannels 477 and package-level active-cooling structure 488 are the same material. Such embodiments may advantageously provide simplicity. In other embodiments, the heat removal fluids are controlled separately. In such embodiments, the heat removal fluids conveyed by die-level microchannels 477 and package-level active-cooling structure 488 may be the same or they may be different. Such embodiments may advantageously provide improved flexibility.

As discussed, IC system 400 includes IC die 402 and optional die-level and package-level active-cooling structures operable to remove heat from IC die 402 to achieve a very low operating temperature of IC die 402. As used herein, the term "very low operating temperature" indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. (e.g., 77K) may be used. In some embodiments, the operating temperature is in a cryogenic temperature operating window (e.g., about −180° C. to about −70° C.). The active-cooling structure may be provided as a package-level structure (i.e., separable from IC die 402), as a die-level structure (i.e., integral to IC die 402), or both. In some embodiments, IC die 402 is deployed in a cold environment, formed using sufficiently conductive materials, etc. and an active-cooling structure is not used.

Figure 5:
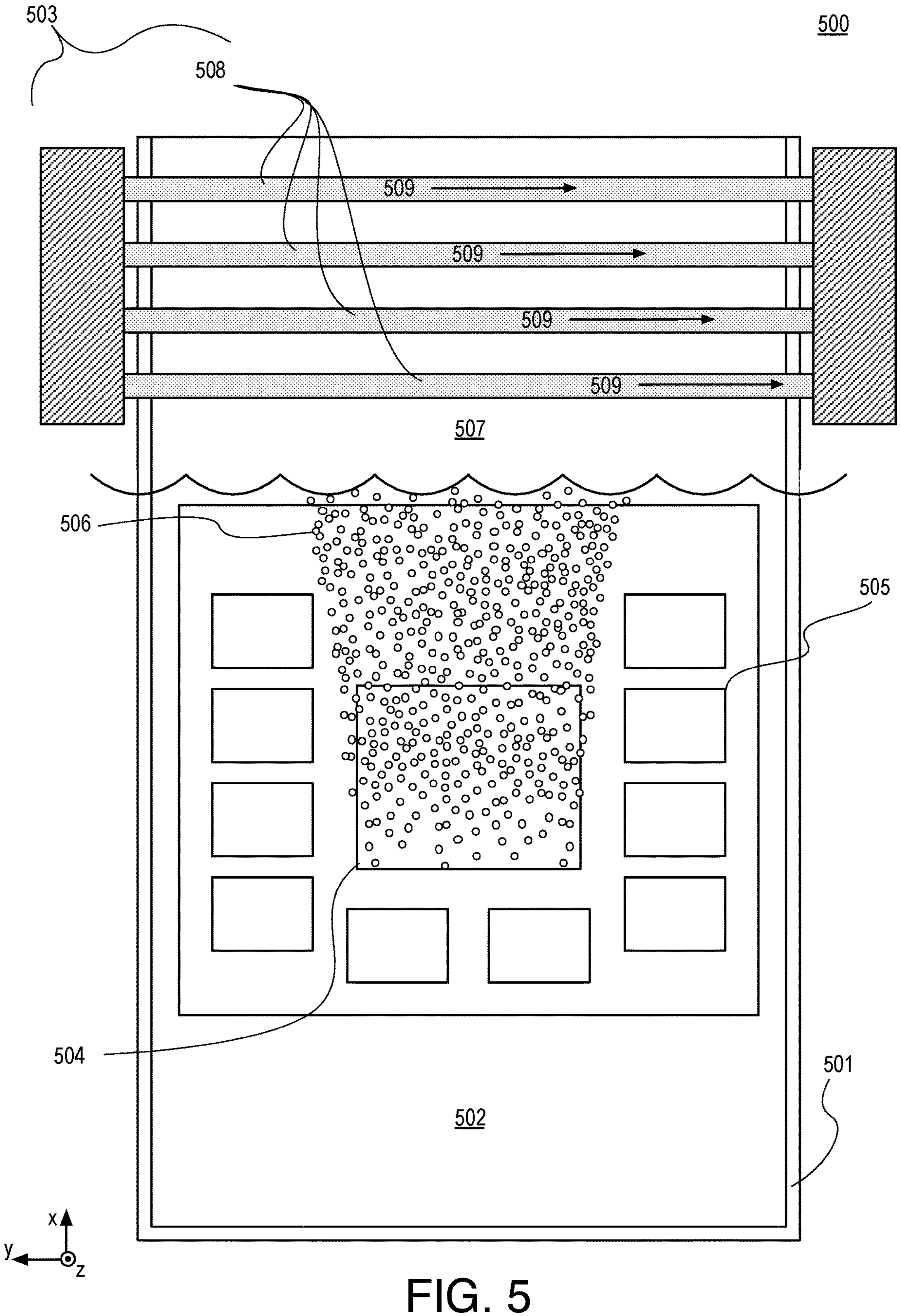
FIG. 5 illustrates a view of an example two-phase immersion cooling system for low-temperature operation of an IC system.

FIG. 5 illustrates a view of an example two-phase immersion cooling system 500 for low-temperature operation of an IC die, in accordance with some embodiments. As shown, two-phase immersion cooling system 500 includes a fluid containment structure 501, a low-boiling point liquid 502 within fluid containment structure 501, and a condensation structure 503 at least partially within fluid containment structure 501. As used herein, the term "low-boiling point liquid" indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 504, such as an IC package including any of IC dies or systems 100, 400 as discussed herein is immersed in low-boiling point liquid 502. In some embodiments, IC dies or systems 100, 400 as deployed in two-phase immersion cooling system 500 do not include additional active cooling structures, although such die-level or package-level active cooling structures may be used in concert with two-phase immersion cooling system 500. In some embodiments, when deployed in two-phase immersion cooling system 500, package-level active-cooling structure 488 is a heat sink, a heat dissipation plate, a porous heat dissipation plate or the like.

Notably, IC die 402 (or IC die 100), is the source of heat in the context of two-phase immersion cooling system 500. For example, IC die 402 may be packaged and mounted on electronics substrate 505. Electronic substrate 505 may be coupled to a power supply (not shown) and may be partially or completely submerged in low-boiling point liquid 502.

In operation, the heat produced by heat generation source 504 vaporizes low-boiling point liquid 502 as shown in vapor or gas state as bubbles 506, which may collect, due to gravitational forces, above low-boiling point liquid 502 as a vapor portion 507 within fluid containment structure 501. Condensation structure 503 may extend through vapor portion 507. In some embodiments, condensation structure 503 is a heat exchanger having a number of tubes 508 with a cooling fluid (i.e., a fluid colder than the condensation point of vapor portion 507) shown by arrows 509 that may flow through tubes 508 to condense vapor portion 507 back to low-boiling point liquid 502. In the IC system of FIG. 5, package-level active-cooling structure 488 includes a passive cooling structure such as a heat sink for immersion in low-boiling point liquid 502.

Figure 6:
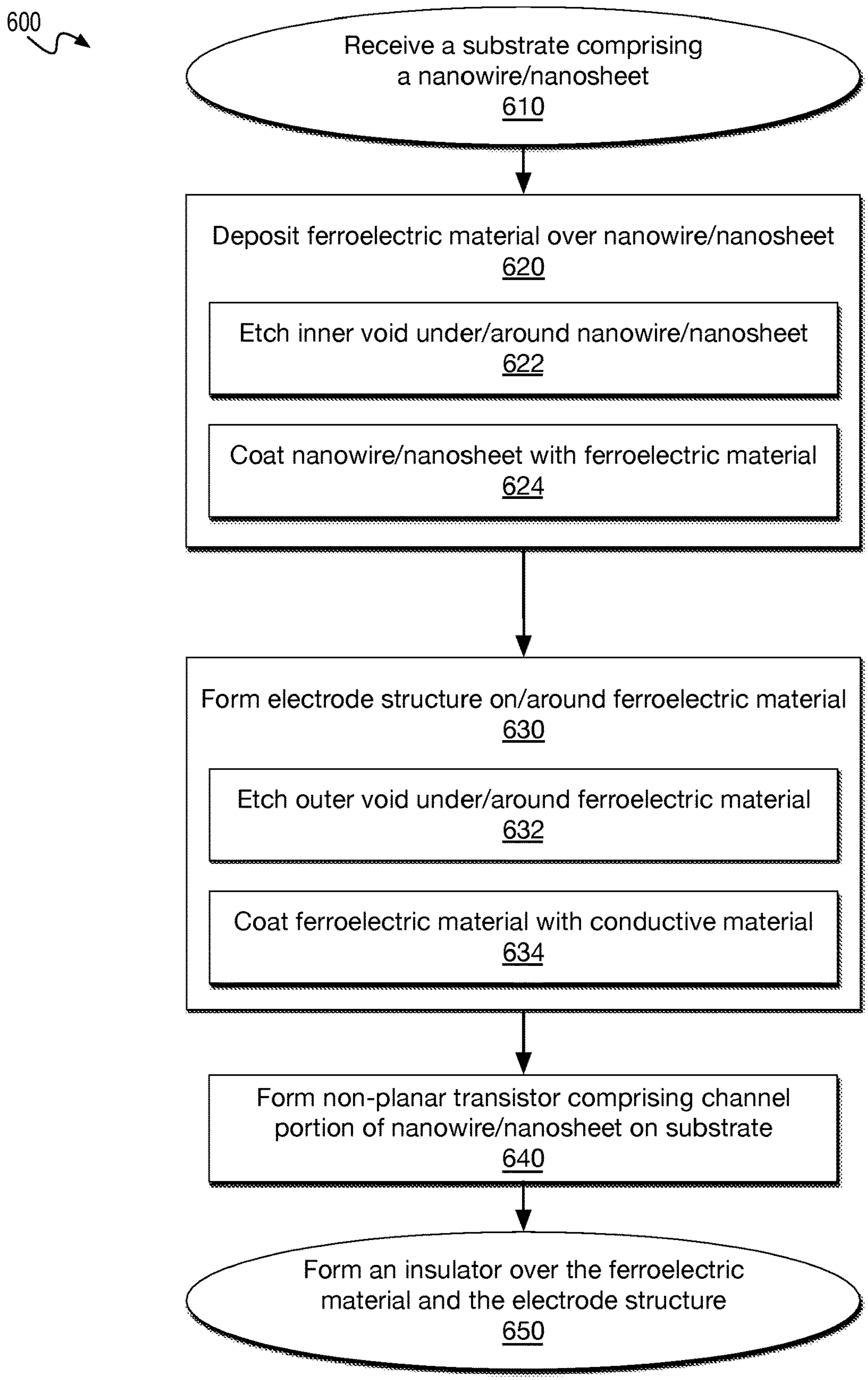
FIG. 6 illustrates various processes or methods for forming a programmable capacitor array with shared nanowire or nanosheet common plate and access transistor on a substrate.

FIG. 6 illustrates various processes or methods for forming a programmable capacitor array with shared nanowire or nanosheet common plate and access transistor on a substrate, in accordance with some embodiments. FIG. 6 shows methods 600 that includes operations 610-650. Some operations shown in FIG. 6 are optional. FIG. 6 shows an example sequence, but the operations can be done in other sequences as well, and some operations may be omitted. Some operations can also be performed multiple times before other operations are performed. Some operations may be included within other operations. Methods 600 generally entail forming groups of ferroelectric capacitors using a nanowire or nanosheet as a shared plate, common to the group, where part of the nanowire or nanosheet is also shared with a non-planar transistor as that transistor's channel.

In operation 610, a substrate including a nanowire or nanosheet is received for forming an array of ferroelectric capacitors. The substrate is a planar platform and may be part of an IC die already including dielectric and metallization structures and, e.g., a non-planar transistor. The substrate may be one of many layers in an IC die, and may itself have many layers. The substrate may be above other layers in the IC die (all or of a portion of which may be subsequently removed in back-side metallization contexts), and other layers may subsequently be formed in or over the substrate.

The substrate may include any suitable material or materials. Any suitable semiconductor or other material can be used. The substrate may include a non-planar transistor, or a non-planar transistor may later be formed on the substrate. In some embodiments, a non-planar transistor is formed concurrently with the ferroelectric capacitors. A transistor sharing or to later be sharing the nanowire or nanosheet may be of the same material as the substrate or, e.g., deposited on the substrate. The substrate may include a semiconductor material that transistors can be formed out of and on, including a crystalline material. In some examples, the substrate may include monocrystalline silicon (Si), germanium (Ge), silicon germanium (SiGe), a III-V alloy material (e.g., gallium arsenide (GaAs)), a silicon carbide (SiC), a sapphire ($Al_2O_3$), or any combination thereof. In some embodiments, the substrate includes crystalline silicon and subsequent components are also silicon.

In operation 620, ferroelectric material is deposited on or around the nanowire or nanosheet. The nanowire or nanosheet will serve as a shared, common plate with a group of unshared, independent plates all capacitively coupled to the nanowire or nanosheet common plate. The ferroelectric material may be deposited, e.g., above, below, and on all sides of the length of the common capacitor region of the nanowire or nanosheet, or ferroelectric material may be deposited separately for each capacitor in the group sharing the nanowire or nanosheet common plate. In some embodiments, ferroelectric material is deposited along the length of the common capacitor region of the nanowire or nanosheet and portions are later removed. In some embodiments, ferroelectric material is deposited along the length of the common capacitor region of the nanowire or nanosheet, no portions are later removed, and capacitors are formed where second, unshared, independent plates are formed over portions of the common capacitor region. In some embodiments, ferroelectric material is deposited separately for each capacitor in the group sharing the nanowire or nanosheet common plate.

Operation 620 may include operation 622 and/or operation 624. In operation 622, a first void is etched under or around the nanowire or nanosheet. A number of nanowires or nanosheets may be stacked one above the other, vertically aligned with, e.g., dielectric material between them. In operation 622, a void is formed to expose one or more portions of the common capacitor region of the nanowire or nanosheet as necessary, including any, e.g., dielectric material. This etch may be a selective etch that leaves one or more nanowires or nanosheets suspended in or over the etched void, e.g., suspended in dielectric material on either side of the void. In some embodiments, e.g., where ferroelectric material is to be deposited separately for each capacitor in the group sharing the nanowire or nanosheet common plate, multiple etches are made in discrete locations where individual capacitors are to be formed. If multiple nanowires or nanosheets are stacked one above the other, an etch may expose more than one of those multiple nanowires or nanosheets at once.

An electrode structure will be formed over the ferroelectric material, and a void may be etched, e.g., in dielectric material, to expose ferroelectric material for forming the electrode structure over. The etch for the electrode structure may be an outer void formed wider in one or more dimensions than the first, inner void etched for the formation of ferroelectric material, but the first void may be wider in one or more dimensions, e.g., along the axis of the nanowire or nanosheet. In some embodiments, a single etch creates a void for forming both the ferroelectric material and the electrode structure.

In operation 624, the nanowire or nanosheet is coated with ferroelectric material. In some embodiments, ferroelectric material is deposited in a plane over the common capacitor region of the nanowire or nanosheet, coating a top surface of the common capacitor region with ferroelectric material. In some embodiments, one or more portions of the nanowire or nanosheet is conformally coated with ferroelectric material, e.g., by ALD. In some such embodiments, a hafnium oxide (such as hafnium zirconium oxide) is deposited by ALD above, below, and on all sides of multiple portions of the common capacitor region of the nanowire or nanosheet following an etch that exposes those portions of the common capacitor region of the nanowire or nanosheet.

In operation 630, an electrode structure is formed on or around the ferroelectric material. This electrode structure forms the second plate of the capacitor, the first being the shared nanowire or nanosheet. Operation 630 may include operation 632 and/or operation 634. In operation 632, a second void is etched under or around the ferroelectric material. This void will be longer in at least one dimension than the first void, as the electrode structure will be outside of the ferroelectric material. The first void may be long in at least one dimension to ensure electrical insulation between capacitor plates. In some embodiments, this void is etched before the void for forming the ferroelectric material. In some embodiments, this void is etched simultaneously as a single void for also forming the ferroelectric material.

In operation 634, the ferroelectric material is coated with a conductive material, e.g., a metal to form the second plate of the capacitor, the plate independent or unshared with other capacitors on the shared nanowire or nanosheet. These plates may be connected with other plates, e.g., by plate-lines, on other nanowires or nanosheets. In some embodiments, a metal is deposited on the ferroelectric material by ALD. In some embodiments, the electrode structure is formed when the remaining void is filled with a metal.

In operation 640, a non-planar transistor may be formed using a portion of the shared nanowire or nanosheet as a transistor channel. In some embodiments, the substrate is received with a non-planar transistor already formed, e.g., such that the common capacitor region of the nanowire or nanosheet is connected to the channel region of the non-planar transistor. In some embodiments, the non-planar transistor is formed concurrently with the capacitors. For example, etches for depositing ferroelectric material and for forming an electrode structure may be done concurrently with an etch to form a gate structure. An electrode structure for a ferroelectric capacitor may be formed while forming a gate electrode. For example, a metal may be deposited over a ferroelectric material concurrently with depositing a metal over a gate dielectric, which (like a ferroelectric material) can be deposited after an etch and before the metal deposition.

In operation 650, an insulator may be formed over, e.g., the ferroelectric material and electrode structure. The insulator may be formed over the top of the capacitor structure or, e.g., over multiple surfaces of the capacitor structure, including by filling in a void remaining after the electrode structure is formed. In some embodiments, the insulator is formed over the non-planar transistor.

Figure 7:
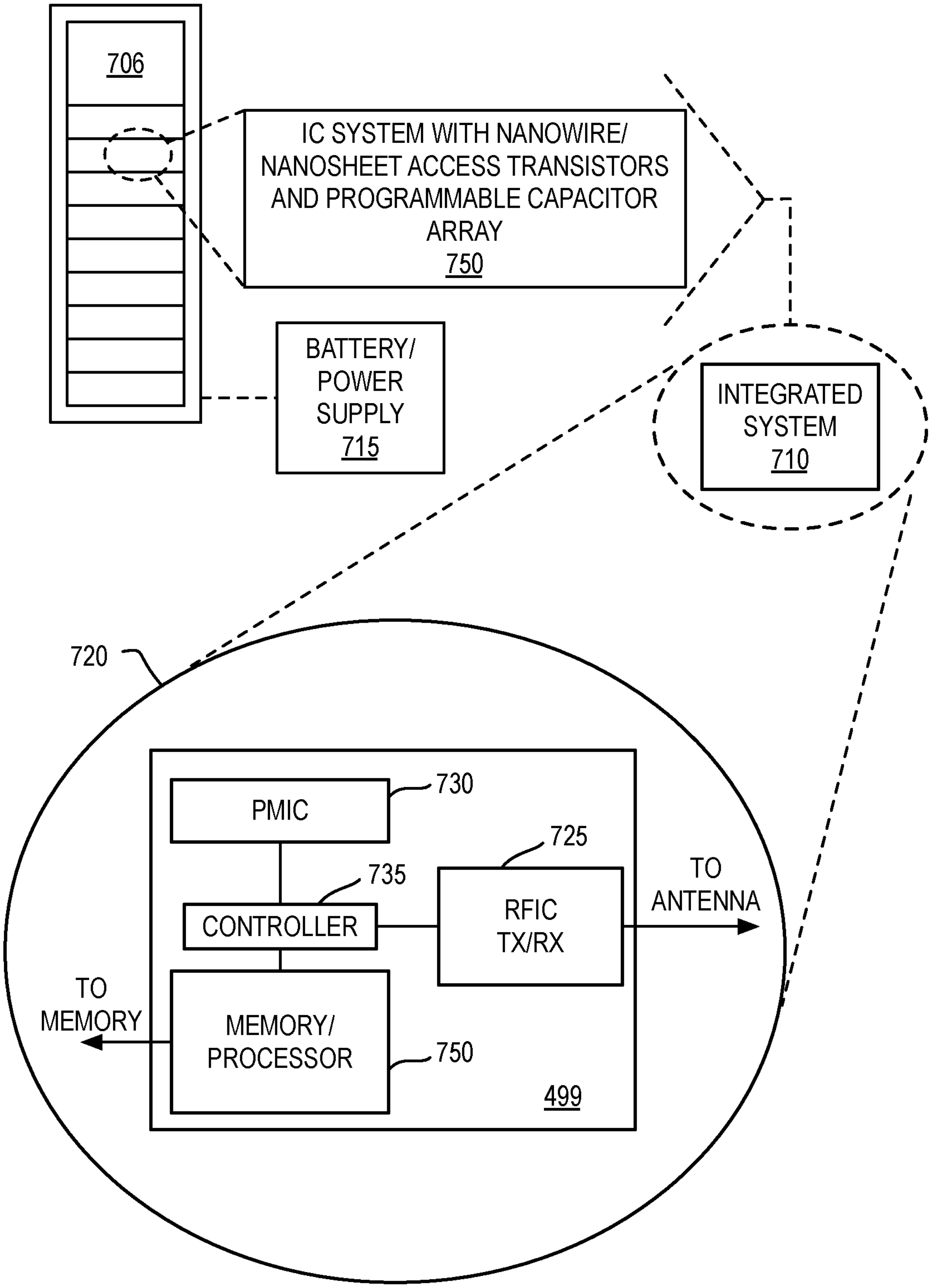
FIG. 7 illustrates a diagram of an example data server machine employing an IC system with stacked access transistors and capacitor memory arrays.

FIG. 7 illustrates a diagram of an example data server machine 706 employing an IC system with a programmable capacitor array having nanowire/nanosheet access transistors, in accordance with some embodiments. Server machine 706 may be any commercial server, for example, including any number of high-performance computing platforms disposed within a rack and networked together for electronic data processing, which in the exemplary embodiment includes one or more devices 750 having a programmable capacitor array with nanowire or nanosheet access transistors.

Also as shown, server machine 706 includes a battery and/or power supply 715 to provide power to devices 750, and to provide, in some embodiments, power delivery functions such as power regulation. Devices 750 may be deployed as part of a package-level integrated system 710. Integrated system 710 is further illustrated in the expanded view 720. In the exemplary embodiment, devices 750 (labeled "Memory/Processor") includes at least one memory chip (e.g., with a programmable capacitor array), and/or at least one processor chip (e.g., a microprocessor, a multi-core microprocessor, or graphics processor, or the like) having the characteristics discussed herein. In an embodiment, device 750 is a microprocessor including a programmable capacitor memory array memory. As shown, device 750 may be a multi-chip module employing one or more IC dies with programmable capacitor arrays having nanowire/nanosheet access transistors, as discussed herein. Device 750 may be further coupled to (e.g., communicatively coupled to) a board, an interposer, or other substrate 499 along with, one or more of a power management IC (PMIC) 730, RF (wireless) IC (RFIC) 725, including a wideband RF (wireless) transmitter and/or receiver (TX/RX) (e.g., including a digital baseband and an analog front end module further comprises a power amplifier on a transmit path and a low noise amplifier on a receive path), and a controller 735 thereof. In some embodiments, RFIC 725, PMIC 730, controller 735, and device 750 include IC dies having programmable capacitor arrays with nanowire/nanosheet access transistors on substrate 499 in a multi-chip module.

FIG. 8 is a block diagram of an example computing device 800, in accordance with some embodiments. For example, one or more components of computing device 800 may include any of the devices or structures discussed herein. A number of components are illustrated in FIG. 8 as being included in computing device 800, but any one or more of these components may be omitted or duplicated, as suitable for the application. In some embodiments, some or all of the components included in computing device 800 may be attached to one or more printed circuit boards (e.g., a motherboard). In some embodiments, various ones of these components may be fabricated onto a single system-on-a-chip (SoC) die. Additionally, in various embodiments, computing device 800 may not include one or more of the components illustrated in FIG. 8, but computing device 800 may include interface circuitry for coupling to the one or more components. For example, computing device 800 may not include a display device 803, but may include display device interface circuitry (e.g., a connector and driver circuitry) to which display device 803 may be coupled. In another set of examples, computing device 800 may not include an audio output device 804, other output device 805, global positioning system (GPS) device 809, audio input device 810, or other input device 811, but may include audio output device interface circuitry, other output device interface circuitry, GPS device interface circuitry, audio input device interface circuitry, audio input device interface circuitry, to which audio output device 804, other output device 805, GPS device 809, audio input device 810, or other input device 811 may be coupled.

Computing device 800 may include a processing device 801 (e.g., one or more processing devices). As used herein, the term "processing device" or "processor" indicates a device that processes electronic data from registers and/or memory (such as a memory device including a programmable capacitor array) to transform that electronic data into other electronic data that may be stored in registers and/or memory. Processing device 801 may include a memory 821 (including a programmable capacitor array), a communication device 822, a refrigeration device 823, a battery/power regulation device 824, logic 825, interconnects 826 (i.e., optionally including redistribution layers (RDL) or metal-insulator-metal (MIM) devices), a heat regulation device 827, and a hardware security device 828.

Processing device 801 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 800 may include a memory 802, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 802 includes memory that shares a die with processing device 801. This memory may be used as cache memory and may include embedded dynamic random-access memory (eDRAM) or spin transfer torque magnetic random-access memory (STT-M RAM).

Computing device 800 may include a heat regulation/refrigeration device 806. Heat regulation/refrigeration device 806 may maintain processing device 801 (and/or other components of computing device 800) at a predetermined low temperature during operation. This predetermined low temperature may be any temperature discussed herein.

In some embodiments, computing device 800 may include a communication chip 807 (e.g., one or more communication chips). For example, the communication chip 807 may be configured for managing wireless communications for the transfer of data to and from computing device 800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 807 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 807 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network.

Communication chip 807 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 807 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 807 may operate in accordance with other wireless protocols in other embodiments. Computing device 800 may include an antenna 813 to facilitate wireless communications and/or to receive other wireless communications (such as AM or FM radio transmissions).

In some embodiments, communication chip 807 may manage wired communications, such as electrical, optical, or any other suitable communication protocols (e.g., the Ethernet). As noted above, communication chip 807 may include multiple communication chips. For instance, a first communication chip 807 may be dedicated to shorter-range wireless communications such as Wi-Fi or Bluetooth, and a second communication chip 807 may be dedicated to longer-range wireless communications such as GPS, EDGE, GPRS, CDMA, WiMAX, LTE, EV-DO, or others. In some embodiments, a first communication chip 807 may be dedicated to wireless communications, and a second communication chip 807 may be dedicated to wired communications.

Computing device 800 may include battery/power circuitry 808. Battery/power circuitry 808 may include one or more energy storage devices (e.g., batteries or capacitors) and/or circuitry for coupling components of computing device 800 to an energy source separate from computing device 800 (e.g., AC line power).

Computing device 800 may include a display device 803 (or corresponding interface circuitry, as discussed above). Display device 803 may include any visual indicators, such as a heads-up display, a computer monitor, a projector, a touchscreen display, a liquid crystal display (LCD), a light-emitting diode display, or a flat panel display, for example.

Computing device 800 may include an audio output device 804 (or corresponding interface circuitry, as discussed above). Audio output device 804 may include any device that generates an audible indicator, such as speakers, headsets, or earbuds, for example.

Computing device 800 may include an audio input device 810 (or corresponding interface circuitry, as discussed above). Audio input device 810 may include any device that generates a signal representative of a sound, such as microphones, microphone arrays, or digital instruments (e.g., instruments having a musical instrument digital interface (MIDI) output).

Computing device 800 may include a GPS device 809 (or corresponding interface circuitry, as discussed above). GPS device 809 may be in communication with a satellite-based system and may receive a location of computing device 800, as known in the art.

Computing device 800 may include other output device 805 (or corresponding interface circuitry, as discussed above). Examples of the other output device 805 may include an audio codec, a video codec, a printer, a wired or wireless transmitter for providing information to other devices, or an additional storage device.

Computing device 800 may include other input device 811 (or corresponding interface circuitry, as discussed above). Examples of the other input device 811 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 800 may include a security interface device 812. Security interface device 812 may include any device that provides security measures for computing device 800 such as intrusion detection, biometric validation, security encode or decode, access list management, malware detection, or spyware detection.

Computing device 800, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-8. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, a memory device comprises a nanowire or nanosheet comprising a channel region and a common capacitor plate region, a plurality of capacitors, wherein individual ones of the capacitors comprise a portion of the common capacitor plate region of the nanowire or nanosheet, a ferroelectric layer, and an independent second capacitor plate, and a non-planar transistor comprising the channel region of the nanowire or nanosheet and a gate electrode.

In one or more second embodiments, further to the first embodiments, the nanowire or nanosheet comprises a dopant and the common capacitor plate region has a concentration of the dopant greater than a concentration of the dopant in the channel region.

In one or more third embodiments, further to the first or second embodiments, the memory device also comprises a plurality of platelines, wherein individual ones of the platelines comprise or are electrically connected to individual ones of the independent second capacitor plates.

In one or more fourth embodiments, further to the first through third embodiments, individual ones of the independent second capacitor plates surround the nanowire or nanosheet in a plane substantially orthogonal to the nanowire or nanosheet.

In one or more fifth embodiments, further to the first through fourth embodiments, the memory device also comprises a bitline, the bitline substantially parallel to individual ones of the platelines, the bitline substantially orthogonal to the nanowire or nanosheet, the bitline electrically connected to the nanowire or nanosheet, wherein the channel region is between the bitline and the common capacitor plate region.

In one or more sixth embodiments, further to the first through fifth embodiments, the memory device also comprises a plurality of second nanowires or nanosheets, and a plurality of second non-planar transistors, the bitline electrically connected to the second nanowires or nanosheets, the second nanowires or nanosheets substantially parallel, individual ones of the second nanowires or nanosheets comprising a channel region and a common capacitor plate region, wherein the plurality of capacitors are in an array, individual ones of the common capacitor plate regions coupled to a set of capacitors.

In one or more seventh embodiments, further to the first through sixth embodiments, the memory device also comprises a wordline, the wordline substantially parallel to individual ones of the platelines, the wordline electrically connected to the gate electrode.

In one or more eighth embodiments, further to the first through seventh embodiments, the memory device also comprises a plurality of second nanowires or nanosheets, and a plurality of second non-planar transistors, the second nanowires or nanosheets substantially parallel, individual ones of the second nanowires or nanosheets comprising a channel region and a common capacitor plate region, individual ones of the second non-planar transistors comprising the channel region and a gate electrode, the wordline electrically connected to the gate electrodes, wherein the plurality of capacitors are in an array, individual ones of the common capacitor plate regions coupled to a set of capacitors.

In one or more ninth embodiments, an IC system comprises an array of nanowires or nanosheets, wherein individual ones of the nanowires or nanosheets comprise a transistor channel and a first capacitor plate, an array of gate structures, wherein individual ones of the gate structures are in contact with corresponding ones of the transistor channels, a plurality of bitlines extending in a first direction, wherein individual ones of the bitlines are coupled to first ends of the transistor channels, and second ends of the transistor channels are coupled to corresponding ones of the first capacitor plates, a plurality of wordlines extending in a second direction substantially orthogonal to the first direction, wherein individual ones of the wordlines are coupled to the gate structures, and an array of capacitors, wherein individual ones of the capacitors comprise a portion of corresponding ones of the first capacitor plates, a second capacitor plate, and a ferroelectric material therebetween.

In one or more tenth embodiments, further to the ninth embodiments, the memory device also comprises a plurality of platelines, wherein individual ones of the platelines are coupled to a plurality of the second capacitor plates.

In one or more eleventh embodiments, further to the ninth or tenth embodiments, the platelines are substantially parallel to the bitlines.

In one or more twelfth embodiments, further to the ninth through eleventh embodiments, the platelines are substantially parallel to the wordlines.

In one or more thirteenth embodiments, further to the ninth through twelfth embodiments, the platelines extend in a third direction substantially orthogonal to both the first direction and the second direction.

In one or more fourteenth embodiments, further to the ninth through thirteenth embodiments, the ferroelectric material comprises oxygen and one of hafnium, zirconium, or niobium.

In one or more fifteenth embodiments, further to the ninth through fourteenth embodiments, individual ones of the gate structures comprise tungsten, cobalt, molybdenum, ruthenium, or both nitrogen and either titanium or tantalum.

In one or more sixteenth embodiments, an IC system comprises a power supply, and an IC die coupled to the power supply, the IC die comprising: a plurality of capacitors comprising a shared inner plate, wherein individual ones of the capacitors comprise an outer plate and a ferroelectric material between the shared inner plate and the outer plate, a transistor comprising a channel portion, and a nanowire or nanosheet comprising the channel portion and the shared inner plate.

In one or more seventeenth embodiments, further to the sixteenth embodiments, the nanowire or nanosheet comprises a dopant and the shared inner plate has a concentration of the dopant greater than a concentration of the dopant in the channel portion.

In one or more eighteenth embodiments, further to the sixteenth or seventeenth embodiments, the memory device also comprises a plurality of platelines, wherein individual ones of the platelines comprise or are electrically connected to individual ones of the outer plates.

In one or more nineteenth embodiments, further to the sixteenth through eighteenth embodiments, the platelines are substantially orthogonal to the nanowire or nanosheet.

In one or more twentieth embodiments, further to the sixteenth through nineteenth embodiments, the IC system comprises or is thermally coupled to a cooling structure, the cooling structure operable to remove heat from an IC die to achieve an operating temperature at or below −25° C.

In one or more twenty-first embodiments, further to the sixteenth through twentieth embodiments, individual ones of the nanowires or nanosheets have a thickness of not more than 2 nm.

In one or more twenty-second embodiments, further to the sixteenth through twenty-first embodiments, a thickness of the ferroelectric material is not more than 7 nm.

In one or more twenty-third embodiments, further to the sixteenth through twenty-second embodiments, a thickness of the ferroelectric material is at least 0.5 nm.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. An apparatus, comprising:

an array of continuous nanowires or nanosheets, wherein individual ones of the continuous nanowires or nanosheets comprise a transistor channel region of the continuous nanowires or nanosheets and a first capacitor plate region of the continuous nanowires or nanosheets;

an array of gate structures, wherein individual ones of the gate structures are in contact with corresponding ones of the transistor channel regions;

a plurality of bitlines extending in a first direction, wherein individual ones of the bitlines are coupled to first ends of the transistor channel regions, and second ends of the transistor channel regions are immediately adjacent to corresponding ones of the first capacitor plate regions;

a plurality of wordlines extending in a second direction substantially orthogonal to the first direction, wherein individual ones of the wordlines are coupled to the gate structures; and an array of capacitors, wherein individual ones of the capacitors comprise a portion of corresponding ones of the first capacitor plate regions, a ferroelectric material surrounding the portion of the first capacitor plate regions, and a second capacitor plate surrounding the ferroelectric material.

2. The apparatus of claim 1, further comprising a plurality of platelines, wherein individual ones of the platelines are coupled to a plurality of the second capacitor plates.

3. The apparatus of claim 2, wherein the platelines are substantially parallel to the bitlines.

4. The apparatus of claim 2, wherein the platelines are substantially parallel to the wordlines.

5. The apparatus of claim 2, wherein the platelines extend in a third direction substantially orthogonal to both the first direction and the second direction.

6. The apparatus of claim 1, wherein the ferroelectric material comprises oxygen and one of hafnium, zirconium, or niobium.

7. The apparatus of claim 1, wherein individual ones of the gate structures comprise tungsten, cobalt, molybdenum, ruthenium, or both nitrogen and either titanium or tantalum.

8. The apparatus of claim 1, wherein the continuous nanowires or nanosheets each comprise a dopant and the first capacitor plate regions have a concentration of the dopant greater than a concentration of the dopant in the transistor channel regions.

9. The apparatus of claim 1, wherein the continuous nanowires or nanosheets each have a thickness of not more than 2 nm.

10. The apparatus of claim 1, wherein a thickness of the ferroelectric material is not more than 7 nm.

11. The apparatus of claim 1, comprising:

a power supply; and an integrated circuit (IC) die coupled to the power supply, the IC die comprising the array of continuous nanowires or nanosheets, the array of gate structures, the plurality of bitlines, the plurality of wordlines, and the array of capacitors.

12. The apparatus of claim 11, comprising:

a cooling structure thermally coupled to the IC die, the cooling structure operable to remove heat from the IC die to achieve an operating temperature of not more than −25° C.

13. An apparatus, comprising:

a plurality of capacitors comprising a shared inner plate, wherein individual ones of the capacitors comprise an outer plate and a ferroelectric material between the shared inner plate and the outer plate;

a transistor comprising a channel portion; and a continuous nanowire or nanosheet comprising the channel portion and the shared inner plate, wherein the ferroelectric material surrounds the shared inner plate and the outer plate surrounds the ferroelectric material.

14. The apparatus of claim 13, comprising:

a bitline extending in a first direction and coupled to a first end of the channel portion;

a wordline extending in a second direction substantially orthogonal to the first direction, the wordline coupled to a gate structure of the transistor; and a plateline coupled to the outer plate.

15. The apparatus of claim 14, wherein the plateline is substantially parallel to the bitline.

16. The apparatus of claim 14, wherein the plateline is substantially parallel to the wordline.

17. The apparatus of claim 14, wherein the plateline extends in a third direction substantially orthogonal to both the first direction and the second direction.

18. The apparatus of claim 13, wherein the ferroelectric material comprises oxygen and one of hafnium, zirconium, or niobium, and wherein a gate structure of the transistor comprises tungsten, cobalt, molybdenum, ruthenium, or both nitrogen and either titanium or tantalum.

19. The apparatus of claim 13, wherein the continuous nanowire or nanosheet comprises a dopant and the shared inner plate has a concentration of the dopant greater than a concentration of the dopant in the channel portion.

20. The apparatus of claim 13, wherein the continuous nanowire or nanosheet has a thickness of not more than 2 nm.

21. The apparatus of claim 13, wherein a thickness of the ferroelectric material is not more than 7 nm.

22. The apparatus of claim 13, comprising:

a power supply; and an integrated circuit (IC) die coupled to the power supply, the IC die comprising the plurality of capacitors, the transistor, and the continuous nanowire or nanosheet.

23. The apparatus of claim 22, comprising:

a cooling structure thermally coupled to the IC die, the cooling structure operable to remove heat from the IC die to achieve an operating temperature of not more than −25° C.

* * * * *